(12) United States Patent
Lee et al.

(10) Patent No.: US 10,535,640 B2
(45) Date of Patent: Jan. 14, 2020

(54) SYSTEM AND METHOD FOR THE FLUIDIC ASSEMBLY OF MICRO-LEDS UTILIZING NEGATIVE PRESSURE

(71) Applicant: eLux Inc., Camas, WA (US)

(72) Inventors: Jong-Jan Lee, Camas, WA (US); Paul J. Schuele, Washougal, WA (US)

(73) Assignee: eLux Inc., Vancouver, WA (US)

( * ) Notice: Subject to any disclaimer, the term of this patent is extended or adjusted under 35 U.S.C. 154(b) by 152 days.

(21) Appl. No.: 15/691,976

(22) Filed: Aug. 31, 2017

(65) Prior Publication Data

US 2018/0012873 A1 Jan. 11, 2018

Related U.S. Application Data

(63) Continuation-in-part of application No. 15/440,735, filed on Feb. 23, 2017, now Pat. No. 10,381,335.
(Continued)

(51) Int. Cl.
*G02F 1/1335* (2006.01)
*H01L 23/00* (2006.01)
(Continued)

(52) U.S. Cl.
CPC .... *H01L 25/0753* (2013.01); *G02F 1/133603* (2013.01); *G09G 3/006* (2013.01); *H01L 24/24* (2013.01); *H01L 24/82* (2013.01); *H01L 24/83* (2013.01); *H01L 24/95* (2013.01); *H01L 25/50* (2013.01); *H01L 33/0095* (2013.01); *H01L 24/92* (2013.01); *H01L 2224/04105* (2013.01); *H01L 2224/24011* (2013.01); *H01L 2224/24226* (2013.01); *H01L 2224/32055* (2013.01);
(Continued)

(58) Field of Classification Search
CPC ......... G02F 1/133514; G02F 1/133603; H01L 33/24; H01L 27/156; H01L 25/0753
See application file for complete search history.

(56) References Cited

U.S. PATENT DOCUMENTS 5,545,291 A 8/1996 Smith et al.
5,594,463 A 1/1997 Sakamoto
(Continued)

OTHER PUBLICATIONS

Bui, Thanh Son, et al. "High optical density and low dielectric constant black matrix containing graphene oxide and carbon black . . . " Displays 34.3 (2013): 192-199.

*Primary Examiner* — Suezu Ellis
(74) *Attorney, Agent, or Firm* — Law Office of Gerald Maliszewski; Gerald Maliszewski

(57) ABSTRACT

An emissive panel and associated assembly method are provided. The method provides an emissive substrate having an insulating layer with a top surface and a back surface, and a dielectric layer overlying the insulating layer patterned to form a plurality of wells. Each well has a bottom surface formed on the insulating layer top surface with a first electrical interface electrically connected to a first conductive pressure channel (CPC). The CPCs are each made up of a pressure via with sidewalls formed between the well bottom surface and the insulating layer back surface. A metal layer coats the sidewalls, and a medium flow passage formed interior to the metal layer. The method uses negative pressure through the CPCs to help capture emissive elements in a liquid flow deposition process.

23 Claims, 18 Drawing Sheets

Related U.S. Application Data which is a continuation-in-part of application No. 15/416,882, filed on Jan. 26, 2017, now Pat. No. 10,446,728, which is a continuation-in-part of application No. 15/413,053, filed on Jan. 23, 2017, which is a continuation-in-part of application No. 15/412,731, filed on Jan. 23, 2017, now Pat. No. 10,418,527, which is a continuation-in-part of application No. 15/410,195, filed on Jan. 19, 2017, now Pat. No. 10,236,279, which is a continuation-in-part of application No. 15/410,001, filed on Jan. 19, 2017, now Pat. No. 9,825,202, which is a continuation-in-part of application No. 14/749,569, filed on Jun. 24, 2015, now Pat. No. 9,722,145, and a continuation-in-part of application No. 15/221,571, filed on Jul. 27, 2016, now Pat. No. 9,755,110, and a continuation-in-part of application No. 15/197,266, filed on Jun. 29, 2016, now Pat. No. 10,249,599, and a continuation-in-part of application No. 15/190,813, filed on Jun. 23, 2016, now Pat. No. 9,892,944, and a continuation-in-part of application No. 15/158,556, filed on May 18, 2016, now Pat. No. 9,985,190, and a continuation-in-part of application No. 15/266,796, filed on Sep. 15, 2016, now Pat. No. 9,917,226, and a continuation-in-part of application No. 14/680,618, filed on Apr. 7, 2015, now Pat. No. 10,115,862, which is a continuation-in-part of application No. 14/530,230, filed on Oct. 31, 2014, now abandoned.

(51) Int. Cl.
  *H01L 25/075* (2006.01)
  *H01L 25/00* (2006.01)
  *G02F 1/13357* (2006.01)
  *G09G 3/00* (2006.01)
  *H01L 33/00* (2010.01)

(52) U.S. Cl.
  CPC ............ *H01L 2224/73267* (2013.01); *H01L 2224/8284* (2013.01); *H01L 2224/82102* (2013.01); *H01L 2224/82104* (2013.01); *H01L 2224/83011* (2013.01); *H01L 2224/83085* (2013.01); *H01L 2224/83194* (2013.01); *H01L 2224/83385* (2013.01); *H01L 2224/83801* (2013.01); *H01L 2224/83815* (2013.01); *H01L 2224/92224* (2013.01); *H01L 2224/95085* (2013.01); *H01L 2924/15151* (2013.01)

(56) References Cited

U.S. PATENT DOCUMENTS

| | | |
|---|---|---|
| 5,824,186 A | 10/1998 | Smith et al. |
| 5,904,545 A | 5/1999 | Smith et al. |
| 6,274,508 B1 | 8/2001 | Jacobsen et al. |
| 6,281,038 B1 | 8/2001 | Jacobsen et al. |
| 6,316,278 B1 | 11/2001 | Jacobsen et al. |
| 6,417,025 B1 | 7/2002 | Gengel |
| 6,420,266 B1 | 7/2002 | Smith et al. |
| 6,468,638 B2 | 10/2002 | Jacobsen et al. |
| 6,479,395 B1 | 11/2002 | Smith et al. |
| 6,527,964 B1 | 3/2003 | Sakariya et al. |
| 6,555,408 B1 | 4/2003 | Jacobsen et al. |
| 6,566,744 B2 | 5/2003 | Gengel |
| 6,586,338 B2 | 7/2003 | Smith et al. |
| 6,590,346 B1 | 7/2003 | Hadley et al. |
| 6,606,247 B2 | 8/2003 | Credelle et al. |
| 6,613,610 B2 | 9/2003 | Iwafuchi et al. |
| 6,618,030 B2 | 9/2003 | Kane et al. |
| 6,623,579 B1 | 9/2003 | Smith et al. |
| 6,657,289 B1 | 12/2003 | Craig et al. |
| 6,665,044 B1 | 12/2003 | Jacobsen et al. |
| 6,683,663 B1 | 1/2004 | Hadley et al. |
| 6,687,987 B2 | 2/2004 | Mayer et al. |
| 6,723,576 B2 | 4/2004 | Nozawa et al. |
| 6,731,353 B1 | 5/2004 | Credelle et al. |
| 6,780,696 B1 | 8/2004 | Schatz |
| 6,816,380 B2 | 11/2004 | Credelle et al. |
| 6,825,499 B2 | 11/2004 | Nakajima et al. |
| 6,850,312 B2 | 2/2005 | Jacobsen et al. |
| 6,863,219 B1 | 3/2005 | Jacobsen et al. |
| 6,870,190 B2 | 3/2005 | Okuyama et al. |
| 6,919,225 B2 | 7/2005 | Craig et al. |
| 6,927,085 B2 | 8/2005 | Hadley et al. |
| 6,980,184 B1 | 12/2005 | Stewart et al. |
| 6,984,927 B2 | 1/2006 | Tomoda et al. |
| 6,985,361 B2 | 1/2006 | Credelle et al. |
| 7,046,328 B2 | 5/2006 | Jacobsen et al. |
| 7,049,207 B2 | 5/2006 | Tomoda |
| 7,049,227 B2 | 5/2006 | Tomoda et al. |
| 7,060,542 B2 | 6/2006 | Nakajima et al. |
| 7,070,851 B2 | 7/2006 | Jacobsen et al. |
| 7,080,444 B1 | 7/2006 | Craig et al. |
| 7,087,934 B2 | 8/2006 | Oohata et al. |
| 7,101,502 B2 | 9/2006 | Smith et al. |
| 7,113,250 B2 | 9/2006 | Jacobsen et al. |
| 7,122,826 B2 | 10/2006 | Okuyama et al. |
| 7,129,514 B2 | 10/2006 | Okuyama et al. |
| 7,141,176 B1 | 11/2006 | Smith et al. |
| 7,172,789 B2 | 2/2007 | Smith et al. |
| 7,179,210 B2 | 2/2007 | Soukeras |
| 7,199,527 B2 | 4/2007 | Holman |
| 7,244,326 B2 | 7/2007 | Craig et al. |
| 7,250,314 B2 | 7/2007 | Nakajima et al. |
| 7,250,320 B2 | 7/2007 | Okuyama et al. |
| 7,260,882 B2 | 8/2007 | Credelle et al. |
| 7,288,432 B2 | 10/2007 | Jacobsen et al. |
| 7,295,180 B2 * | 11/2007 | Ichikawa ............... G09G 3/342 315/308 |
| 7,317,211 B2 | 1/2008 | Watanabe et al. |
| 7,317,435 B2 | 1/2008 | Hsueh |
| 7,321,159 B2 | 1/2008 | Schatz |
| 7,353,598 B2 | 4/2008 | Craig et al. |
| 7,417,306 B1 | 8/2008 | Jacobsen et al. |
| 7,425,467 B2 | 9/2008 | Jacobsen et al. |
| 7,452,748 B1 | 11/2008 | Craig et al. |
| 7,500,610 B1 | 3/2009 | Hadley et al. |
| 7,531,218 B2 | 5/2009 | Smith et al. |
| 7,542,301 B1 | 6/2009 | Liong et al. |
| 7,561,221 B2 | 7/2009 | Jacobsen et al. |
| 7,564,064 B2 | 7/2009 | Oohata et al. |
| 7,572,649 B2 | 8/2009 | Kanemitsu et al. |
| 7,573,194 B2 | 8/2009 | Doi et al. |
| 7,576,656 B2 | 8/2009 | Craig et al. |
| 7,589,355 B2 | 9/2009 | Tomoda et al. |
| 7,615,479 B1 | 11/2009 | Craig et al. |
| 7,619,598 B2 | 11/2009 | Pulvirenti et al. |
| 7,662,008 B2 | 2/2010 | Hillis et al. |
| 7,723,764 B2 | 5/2010 | Oohata et al. |
| 7,763,901 B2 | 7/2010 | Tomoda |
| 7,774,929 B2 | 8/2010 | Jacobs |
| 7,795,049 B2 | 9/2010 | Watanabe et al. |
| 7,795,629 B2 | 9/2010 | Watanabe et al. |
| 7,838,410 B2 | 11/2010 | Hirao et al. |
| 7,880,184 B2 | 2/2011 | Iwafuchi et al. |
| 7,884,543 B2 | 2/2011 | Doi |
| 7,888,690 B2 | 2/2011 | Iwafuchi et al. |
| 7,927,976 B2 | 4/2011 | Menard |
| 7,931,063 B2 | 4/2011 | Craig et al. |
| 7,968,474 B2 | 6/2011 | Martin et al. |
| 7,977,130 B2 | 7/2011 | Hillis et al. |
| 8,068,661 B2 | 11/2011 | Onushkin et al. |
| 8,101,457 B2 | 1/2012 | Tomoda et al. |
| 8,222,659 B2 | 7/2012 | Tomoda |
| 8,232,640 B2 | 7/2012 | Tomoda et al. |
| 8,252,164 B2 | 8/2012 | Martin et al. |
| 8,257,538 B2 | 9/2012 | Doi et al. |
| 8,284,120 B2 | 10/2012 | Hillis et al. |
| 8,300,007 B2 | 10/2012 | Hillis et al. |
| 8,312,619 B2 | 11/2012 | Chow et al. |

(56) References Cited

U.S. PATENT DOCUMENTS

| | | |
|---|---|---|
| 8,333,860 B1 | 12/2012 | Bibl et al. |
| 8,349,116 B1 | 1/2013 | Bibl et al. |
| 8,361,268 B2 | 1/2013 | Mizuno et al. |
| 8,361,297 B2 | 1/2013 | Mayer et al. |
| 8,379,003 B2 | 2/2013 | Kawaguchi et al. |
| 8,382,544 B2 | 2/2013 | Hillis et al. |
| 8,383,506 B1 | 2/2013 | Golda et al. |
| 8,384,116 B2 | 2/2013 | Ohtorii et al. |
| 8,390,537 B2 | 3/2013 | Hillis et al. |
| 8,409,886 B2 | 4/2013 | Iwafuchi et al. |
| 8,415,767 B1 | 4/2013 | Golda et al. |
| 8,415,768 B1 | 4/2013 | Golda et al. |
| 8,415,771 B1 | 4/2013 | Golda et al. |
| 8,415,879 B2 | 4/2013 | Lowenthal et al. |
| 8,426,227 B1 | 4/2013 | Bibl et al. |
| 8,445,926 B2 * | 5/2013 | Park ............... G02F 1/133603 257/100 |
| 8,476,826 B2 | 7/2013 | Oohata et al. |
| 8,518,204 B2 | 8/2013 | Hu et al. |
| 8,552,436 B2 | 10/2013 | Bibl et al. |
| 8,558,243 B2 | 10/2013 | Bibl et al. |
| 8,569,115 B1 | 10/2013 | Golda et al. |
| 8,570,482 B2 | 10/2013 | Hillis et al. |
| 8,573,469 B2 | 11/2013 | Hu et al. |
| 8,628,994 B2 | 1/2014 | Tomoda |
| 8,646,505 B2 | 2/2014 | Bibl et al. |
| 8,648,328 B2 | 2/2014 | Crowder et al. |
| 8,669,703 B2 | 3/2014 | Hillis et al. |
| 8,683,416 B1 | 3/2014 | Trivedi et al. |
| 8,685,774 B2 | 4/2014 | Crowder et al. |
| 8,686,447 B2 | 4/2014 | Tomoda et al. |
| 8,686,542 B2 | 4/2014 | Golda et al. |
| 8,711,063 B2 | 4/2014 | Hillis et al. |
| 8,789,573 B2 | 7/2014 | Bibl et al. |
| 8,809,126 B2 | 8/2014 | Lowenthal et al. |
| 8,846,457 B2 | 9/2014 | Lowenthal et al. |
| 8,906,713 B2 | 12/2014 | Rettke |
| 9,240,397 B2 | 1/2016 | Bibl et al. |
| 9,252,375 B2 | 2/2016 | Bibl et al. |
| 9,269,322 B2 | 2/2016 | Nathan et al. |
| 9,293,476 B2 | 3/2016 | Bedell et al. |
| 9,305,807 B2 | 4/2016 | Whiting et al. |
| 9,318,475 B2 | 4/2016 | Bibl et al. |
| 9,343,448 B2 | 5/2016 | Sakariya et al. |
| 9,755,110 B1 * | 9/2017 | Crowder ............... H01L 27/156 |
| 9,837,390 B1 * | 12/2017 | Sorensen ............... H05K 3/284 |
| 2002/0153606 A1 | 10/2002 | Gengel |
| 2005/0206585 A1 | 9/2005 | Stewart et al. |
| 2005/0233504 A1 | 10/2005 | Doi et al. |
| 2006/0180821 A1 * | 8/2006 | Fan ............... F21K 9/00 257/98 |
| 2007/0111539 A1 * | 5/2007 | Kon ............... C09D 183/04 438/778 |
| 2010/0186883 A1 | 7/2010 | Tomoda |
| 2011/0266039 A1 | 11/2011 | Tomoda |
| 2011/0273410 A1 | 11/2011 | Park et al. |
| 2012/0169786 A1 | 7/2012 | Okuyama et al. |
| 2012/0218318 A1 | 8/2012 | Hirao et al. |
| 2013/0126098 A1 | 5/2013 | Bibl et al. |
| 2013/0126827 A1 | 5/2013 | Bibl et al. |
| 2013/0128585 A1 | 5/2013 | Bibl et al. |
| 2013/0210194 A1 | 8/2013 | Bibl et al. |
| 2014/0008691 A1 | 1/2014 | Tomoda et al. |
| 2014/0048909 A1 | 2/2014 | Golda et al. |
| 2014/0084482 A1 | 3/2014 | Hu et al. |
| 2014/0277680 A1 | 9/2014 | Youngquist |
| 2015/0155445 A1 | 6/2015 | Zhan et al. |
| 2015/0179877 A1 | 6/2015 | Hu et al. |
| 2015/0214430 A1 | 7/2015 | Zhan et al. |
| 2015/0263066 A1 | 9/2015 | Hu et al. |
| 2016/0086534 A1 | 3/2016 | Seo et al. |

* cited by examiner

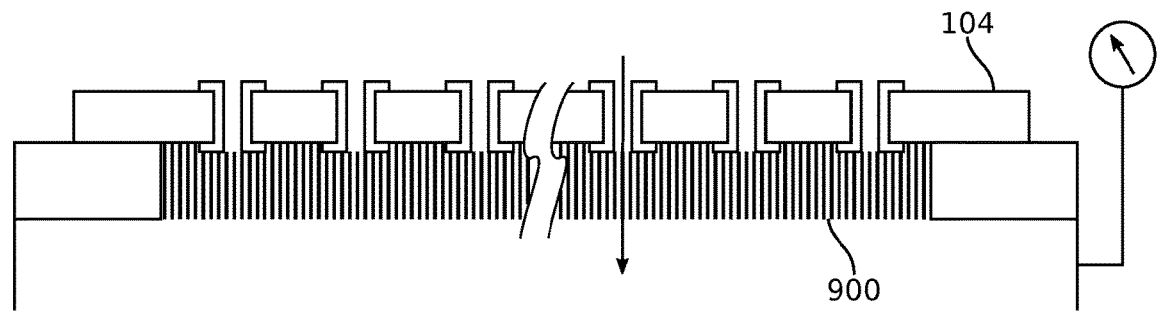
Fig. 9A
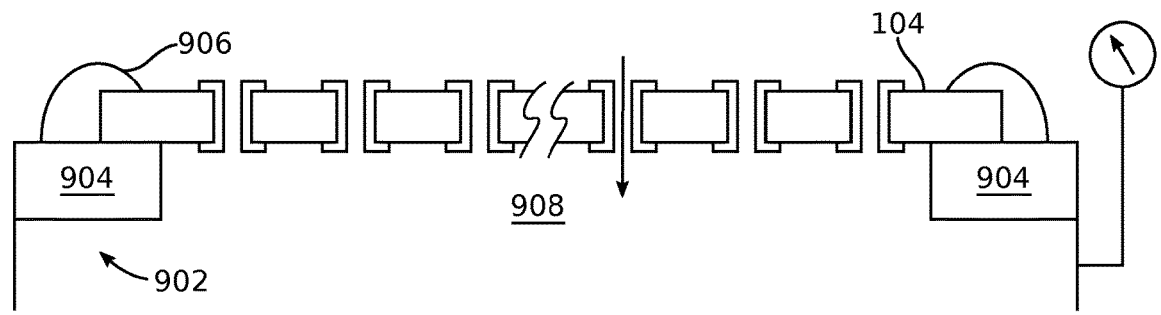
Fig. 9B
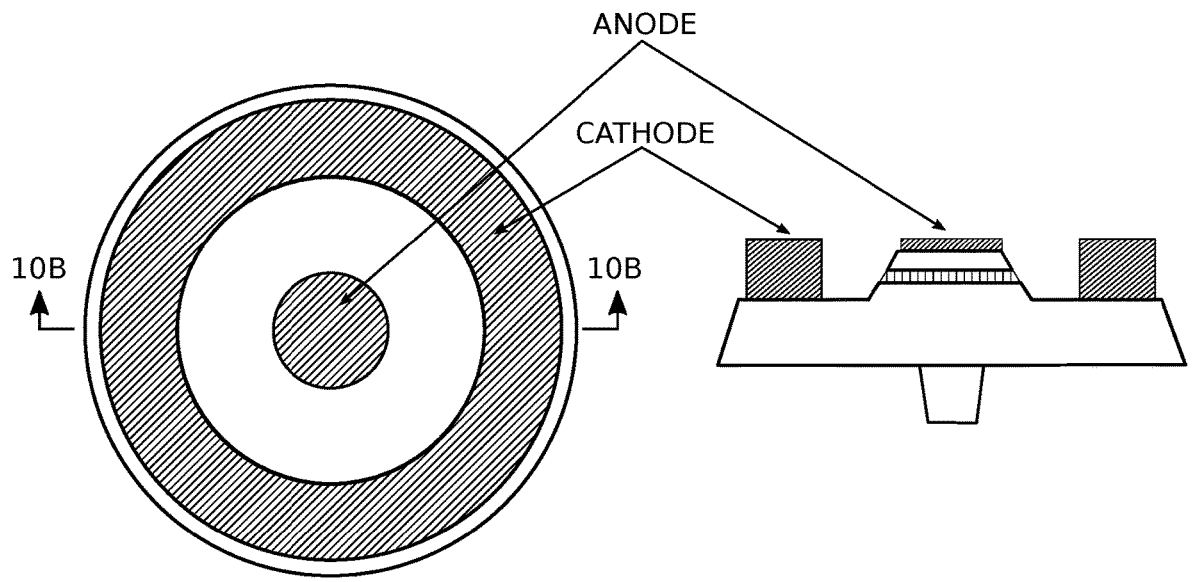
Fig. 10A                    Fig. 10B

SYSTEM AND METHOD FOR THE FLUIDIC ASSEMBLY OF MICRO-LEDS UTILIZING NEGATIVE PRESSURE

RELATED APPLICATIONS

Any and all applications, if any, for which a foreign or domestic priority claim is identified in the Application Data Sheet of the present application are hereby incorporated by reference under 37 CFR 1.57.

BACKGROUND OF THE INVENTION

1. Field of the Invention

This invention generally relates to device assembly on a printed circuit board (PCB) and, more particularly, to a fluidic assembly method for the fabrication of emissive panels on PCBs using negative pressure features.

2. Description of the Related Art

The fluidic transfer of microfabricated electronic devices, optoelectronic devices, and sub-systems from a donor substrate/wafer to a large area and/or unconventional substrate provides a new opportunity to extend the application range of electronic and optoelectronic devices. For example, display pixel size light emitting diode (LED) micro structures, such as rods, fins, or disks, can be first fabricated on small size wafers and then be transferred to large panel substrate to make a direct emitting display. One conventional means of transferring these LED microstructures is through a pick-and-place process. However, with a display comprising millions of elements, such a process may take several hours to complete and is therefore inefficient.

The fluidic self-assembly of electronic devices, such as LEDs and photovoltaics, is often performed by surface energy minimization at molten solder capillary interfaces so that both mechanical and electrical connections can be made to an electrode during assembly, as demonstrated in U.S. Pat. No. 7,774,929. In one aspect, electronic devices are captured in shape-matched well structures, followed by electrical integration processes, as demonstrated in U.S. Pat. No. 6,316,278.

Some problems yet to be addressed with conventional fluidic assembly processes are related to the distribution method over large scales, the integration of microcomponents to drive circuitry over large areas, and the potential mechanisms for the repair of defective microcomponents. Over large scales, conventional fluidic assembly into wells is challenged by the dual requirements of maximum velocities for microcomponent capture and minimum distribution velocities for high-speed array assembly. Similarly, achieving the microcomponent dispensing scheme and flow velocity uniformity necessary for a high yield over the whole assembly substrate becomes very challenging over greater-than-centimeter scales.

An LED is considered as a spot light source with light radiating from a point, much like a point source. A spot light, however, limits the illumination to light within a specified cone or beam of light only. In many applications, it is desirable to use LEDs for uniform illumination over an area. It is common to use an array of LEDs to make such an area light source. For example, in an LED direct back lit liquid crystal display (LCD), an array of LEDs is placed behind an LCD display. Diffuser films or brightness enhancing film can be inserted between the LED array and LCD display to improve the backlight uniformity.

Micro-LED (µLED) process and devices have been disclosed previously in an application entitled, DISPLAY WITH SURFACE MOUNT EMISSIVE ELEMENTS, invented by Schuele et al., filed Jan. 19, 2017, Ser. No. 15/410,001, and in an application entitled, SYSTEM AND METHOD FOR THE FLUIDIC ASSEMBLY OF EMISSIVE DISPLAYS, invented by Sasaki et al, Ser. No. 15/412,731, filed Jan. 23, 2017, which are incorporated herein by reference. Although various substrates can be used for µLED devices, glass is typically the default substrate. This makes sense since it is industrial standard to fabricate thin film transistor (TFT) circuitry on a glass substrate. However, some µLED applications, such as a backlight unit for LCD displays (BLU) and flat panel lighting features, can be configured as passive matrix arrays, which do not need TFT circuits to drive the µLEDs. For these applications, a glass substrate is not required and there would be the advantages of lower cost and increased flexibility if alternate types of substrates could be used.

It would be advantageous if the substrates could be designed with features to enhance the capture of emissive elements using a negative pressure.

SUMMARY OF THE INVENTION

Disclosed herein is a light emitting diode (LED) array that is fabricated on a printed circuit board (PCB) substrate, which may be flexible. The substrate simply requires two layers of metal wiring to enable the LED array, one on the front surface and the other on the back surface of the substrate. A via hole is made by laser drilling prior the metal formation. During the metal formation process, the via hole is partially filled with the metal to enable electrical interconnection between front surface metal and back surface metal. The via holes also serve as pressure channels through the substrate, which enables control of gas or fluid flow by applying a pressure differential across the substrate.

Accordingly, a fluidic assembly method is provided for the fabrication of emissive panels. The method provides an emissive substrate having an insulating layer with a top surface and a back surface, and a dielectric layer overlying the insulating layer top surface patterned to form a plurality of wells. Each well has a bottom surface formed on the insulating layer top surface with a first electrical interface electrically connected to a first conductive pressure channel. The conductive pressure channels are each made up of a pressure via with sidewalls formed between the well bottom surface and the insulating layer back surface. A metal layer coats the sidewalls, and a medium flow passage formed interior to the metal layer. Each pressure via has a minimum cross-sectional area, and the medium flow passage has a minimum cross-sectional area greater than 50% of the pressure via minimum cross-sectional area.

The first electrical interface is directly or indirectly connected through intervening elements to a conductive first matrix trace. The emissive substrate also includes a conductive second matrix of traces. The first matrix traces may be formed on either the insulating layer top surface or the insulating layer bottom surface, with the second matrix traces being formed on the opposite insulating layer surface. The first and second matrices are control lines used to selectively enable individual emissive elements or groups of emissive elements.

The method flows a liquid suspension of emissive elements across the dielectric layer, and applies a negative pressure, from the insulating layer back surface to the wells, via the first conductive pressure channels. The emissive elements have a first electrical contact formed on their top surfaces and, optionally, a post connected to, and extending from their bottom surfaces. The emissive elements are captured in the wells in response to the negative pressure and liquid suspension flow, with their top surfaces facing the well bottom surfaces. After capture, the emissive substrate is annealed. In response to the annealing, the first electrical contact of each emissive element is connected to the first electrical interface of a corresponding well. In one aspect, prior to annealing the emissive substrate, solder flux is introduced to each first electrical interface through a corresponding first conductive pressure channel.

In one type of emissive substrate, each well bottom surface includes a second electrical interface electrically connected to a second conductive pressure channel formed between the insulating layer top and back surfaces. The second matrix traces are directly or indirectly connected to corresponding second conductive pressure channels. In this aspect the emissive elements have a top surface with both the first electrical contact and a second electrical contact, and the second electrical contact becomes connected to the second electrical interface when the emissive substrate is annealed.

In another type of emissive substrate, the first matrix traces are formed on the insulating layer bottom surface, and each well bottom surface additionally includes a second electrical interface electrically connected by a conductive intralevel trace, formed on the insulating layer top surface, to a corresponding second matrix trace. The emissive elements have a top surface with the first electrical contact and a second electrical contact, and the second electrical contact becomes connected to the second electrical interface when the emissive substrate is annealed.

In yet another type of emissive substrate, the first matrix traces are formed on the insulating layer bottom surface, and the dielectric layer has an intersection via associated with each well, exposing a corresponding second matrix trace on the insulating layer top surface. In this version the emissive elements have a top surface with the first electrical contact and a bottom surface with a second electrical contact. Subsequent to annealing the emissive substrate, when the first electrical contact is connected to the first electrical interface, a local interconnect is from the second electrical contact of each emissive element to the corresponding second matrix trace on the insulating layer top surface through a corresponding intersection via.

After connecting the emissive elements electrical contacts to the emissive substrate, a color modifier may be formed overlying the top surface of the dielectric and, optionally, a liquid crystal display (LCD) panel may be formed overlying the top surface of the color modifier.

Additional details of the above-described method and an emissive panel apparatus are provided below.

BRIEF DESCRIPTION OF THE DRAWINGS

FIGS. 9A and 9B depict alternative support mechanisms.

FIGS. 10A through 10D depict exemplary steps in the capture of emissive elements in the emissive panel.

DETAILED DESCRIPTION

Figure 1A:
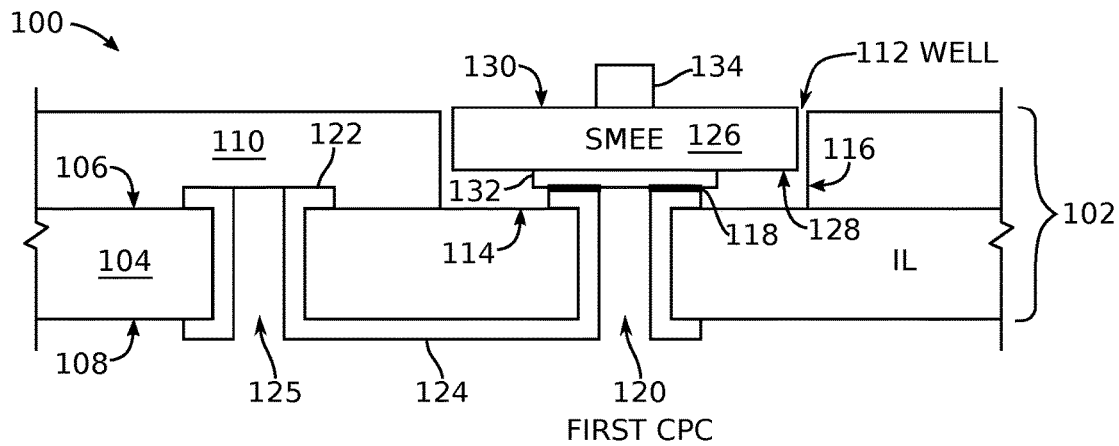
FIGS. 1A and 1B are partial cross-sectional views of an emissive panel, highlighting a conductive pressure channel.
Figure 1B:
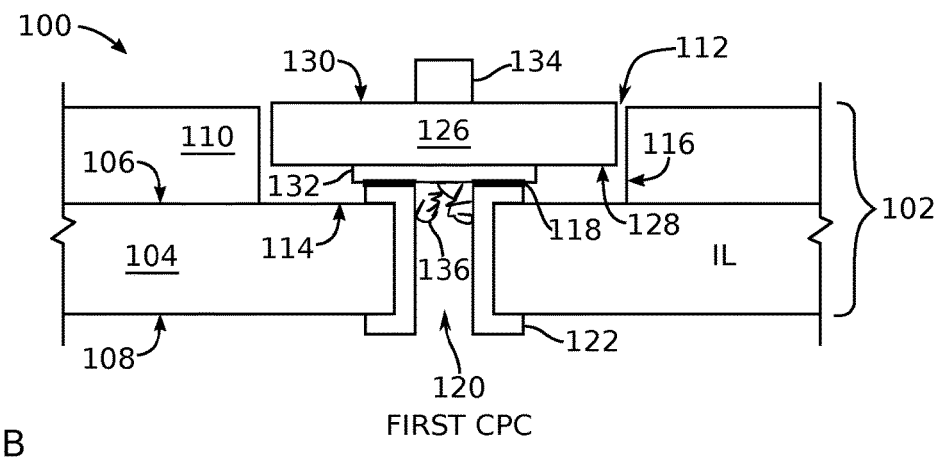

FIGS. 1A and 1B are partial cross-sectional views of an emissive panel, highlighting a conductive pressure channel. The emissive panel 100 comprises an emissive substrate 102, which in turn comprises an insulating layer (IL) 104 with a top surface 106 and a back surface 108. A dielectric layer 110 overlies the insulating layer top surface 106, patterned to form a first plurality of wells 112 (one well is shown). Each well 112 comprises a bottom surface 114 formed on an exposed region of the insulating layer top surface 106, well sidewalls 116 formed in the dielectric layer 110, a first electrical interface 118 formed on the well bottom surface, and a first conductive pressure channel (CPC) 120 formed between the first electrical interface 118 and the insulating layer back surface 108.

A control matrix comprising a conductive first matrix of traces 122 is formed on the insulating layer top surface 106 (FIG. 1A), and in FIG. 1B the first matrix of traces 122 is formed on the insulating layer back surface 108, as explained in more detail in the figures to follow. Because of the number of possible variations, the second matrix of traces, as well as the emissive element second electrical contact, are not shown in these figures, but are explained in detail below. As would be understood by a practitioner in the art, the first and second matrices permit emissive elements to be selectively enabled, either individually or in groups. Each first conductive pressure channel 120 is operatively connected to corresponding traces 122 in the first matrix as shown in FIG. 1A or FIG. 1B. As used herein, "operatively connected" is defined as either directly connected, or indirectly connected through elements such as intralevel traces, interlevel traces, local interconnects, and interlevel vias. As shown in FIG. 1A, first CPC 120 is connected to first matrix trace 122 on the IL top surface 106 by way of intralevel trace 124 and via 125. Via 125 is depicted as a conductive pressure channel, but alternatively, it may be a conventional via without a medium flow passage, as explained in more detail below. As shown in FIG. 1B, the first CPC 120 is more directly connected to first matrix trace 122 located on the IL back surface 108.

Surface mount emissive elements (SMEEs) 126 populate the wells 112. Each emissive element 126 comprises a top surface 128 overlying a corresponding well bottom surface 114, and a bottom surface 130. A first electrical contact 132 is formed on the emissive element top surface 128 and is connected to a corresponding well first electrical interface 118. In one aspect as shown, each SMEE 126 has a post 134 extending from, and connected to its bottom surface 130. In one aspect as shown in FIG. 1B, solder flux residue 136 resides on the emissive element first electrical contact 132 and in the first conductive pressure channel 120. Note: the emissive element surface facing (adjacent to) the well bottom surface is defined herein as the "top" surface to maintain correspondence with terms used in associated emissive element fabrication processes.

Figure 2A:
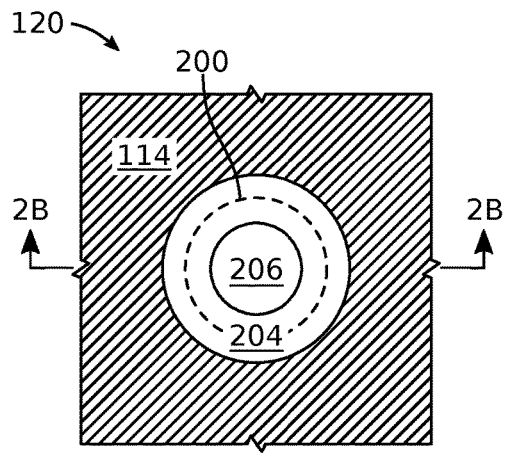
FIGS. 2A and 2B are, respectively, plan and partial cross-sectional views of a conductive pressure channel.
Figure 2B:
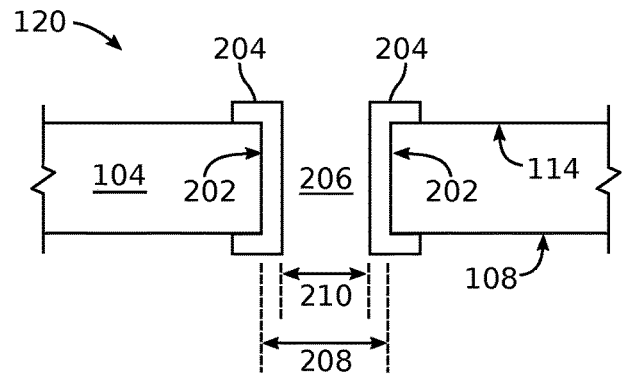

FIGS. 2A and 2B are, respectively, plan and partial cross-sectional views of a conductive pressure channel. Each conductive pressure channel 120 comprises a pressure via 200 with sidewalls 202 formed between the well bottom surface and the insulating layer back surface. A metal layer 204 coats the sidewalls 202, and a medium flow passage 206 is formed interior to the metal layer 204. Each pressure via 200 has a minimum cross-sectional area 208 and the medium flow passage 206 has a minimum cross-sectional 210 area greater than 50% of the pressure via minimum cross-sectional area. The medium flow passage 206 permits the flow of gaseous or liquid mediums.

Figure 3A:
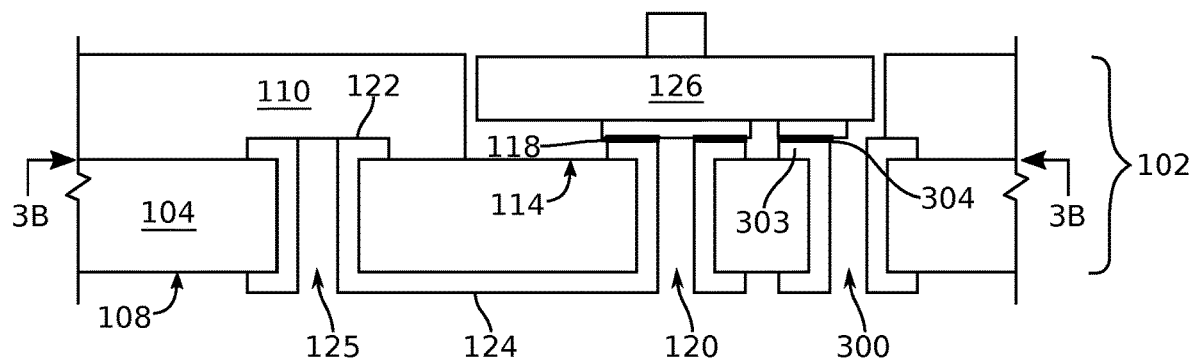
FIGS. 3A and 3B are, respectively, a partial cross-sectional view of a first variation of the emissive substrate and a plan view of its insulating layer top surface.
Figure 3B:
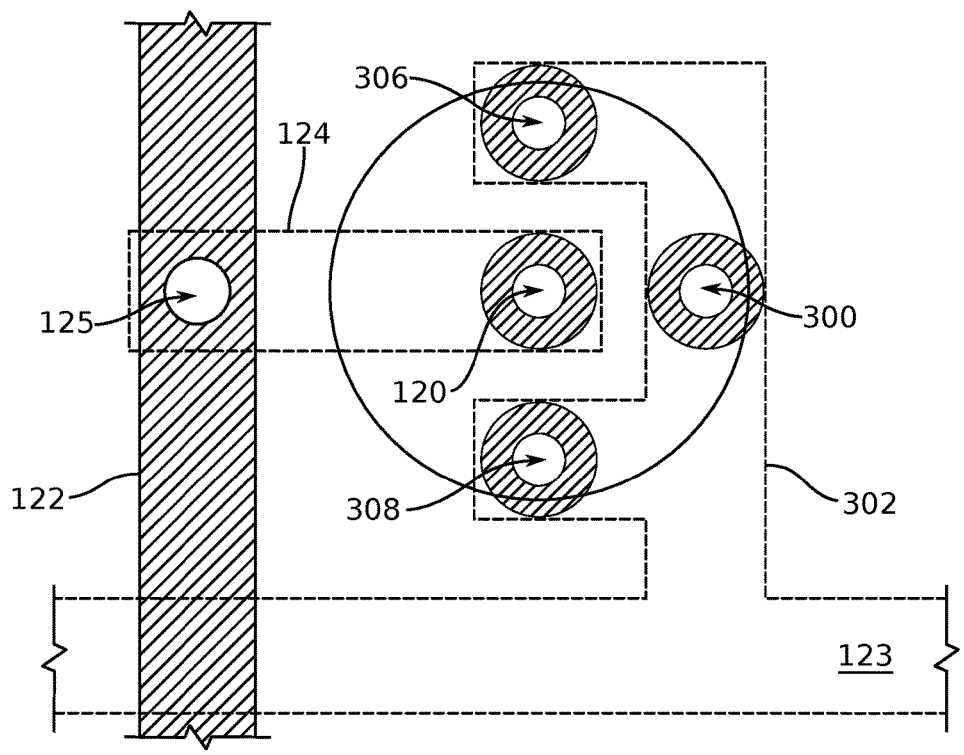

FIGS. 3A and 3B are, respectively, a partial cross-sectional view of a first variation of the emissive substrate and a plan view of its insulating layer top surface. In this aspect, the emissive substrate 102 further comprises a second electrical interface 303 formed on each well bottom surface 114. A second conductive pressure channel 300 is formed between the second electrical interface 303 and the insulating layer back surface. In this example, the first CPC 120 is operatively connected to the first matrix trace 122, so the second CPC 300 is operatively connected to the corresponding trace 123 of the second matrix by way of intralevel trace 302. Note: the traces on the insulating layer back surface in FIG. 3B are shown in phantom. Each emissive element 126 further comprises a second electrical contact 304 formed on the emissive element top surface, connected to a corresponding well second electrical interface 303. As shown in FIG. 3B, the emissive substrate may comprise a plurality of second CPCs, additionally shown as CPCs 306 and 308, such as might be used if the emissive element second electrical contact is a ring formed around the perimeter of the emissive element top surface.

Figure 4A:
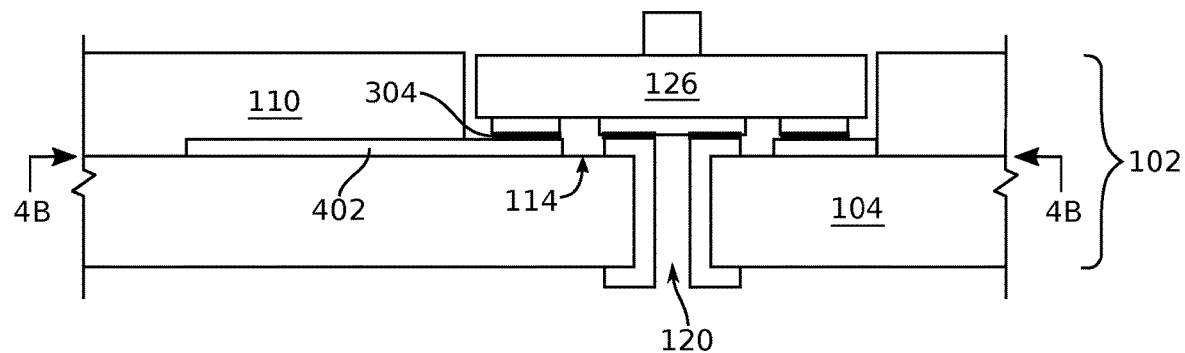
FIGS. 4A and 4B are, respectively, a partial cross-sectional view of a second variation of the emissive substrate and a plan view of its insulating layer top surface.
Figure 4B:
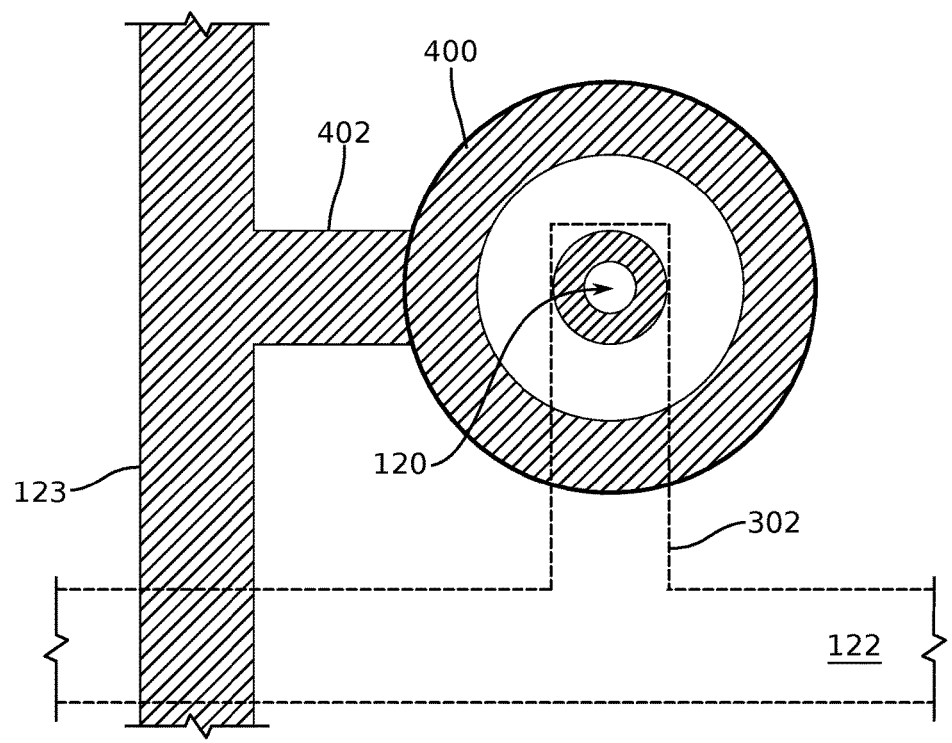

FIGS. 4A and 4B are, respectively, a partial cross-sectional view of a second variation of the emissive substrate and a plan view of its insulating layer top surface. The emissive substrate 102 comprises a second electrical interface 400 formed on each well bottom surface 114. An intralevel trace 402 connects each second matrix trace 123 to corresponding second electrical interfaces 400. Each emissive element 126 comprises a second electrical contact 304 formed on the emissive element top surface, connected to a corresponding well second electrical interface 400.

Figure 5A:
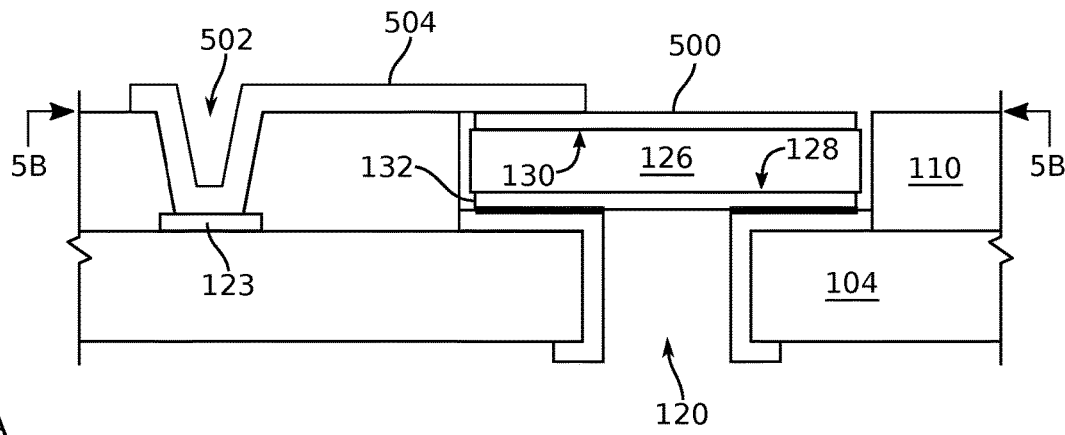
FIGS. 5A and 5B are, respectively, a partial cross-sectional view of a third variation of the emissive substrate and a plan view of its dielectric layer top surface.
Figure 5B:
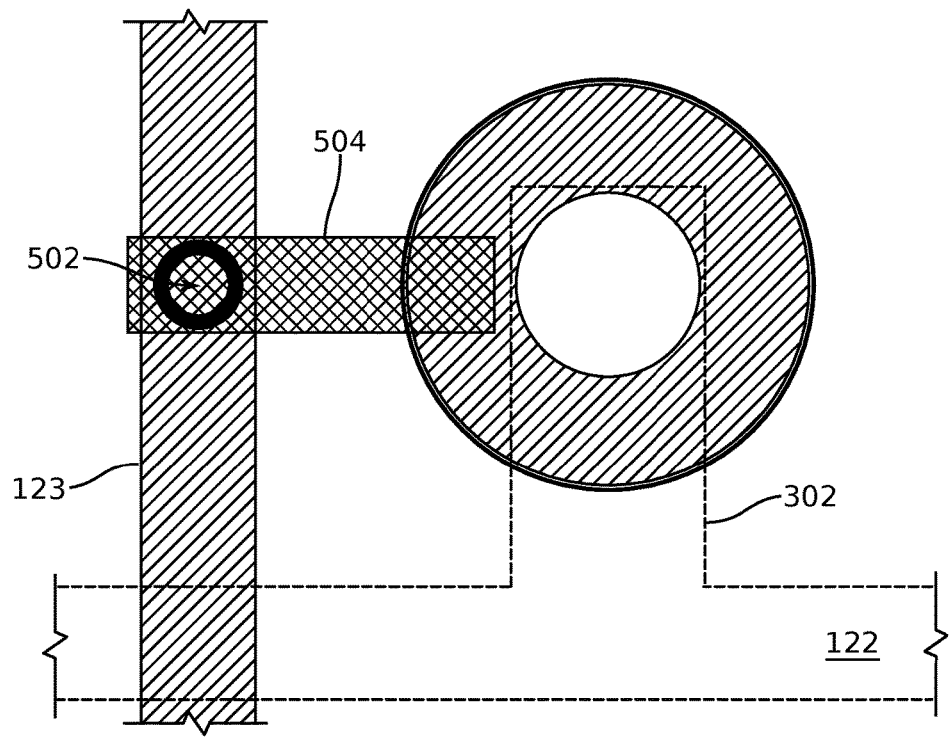

FIGS. 5A and 5B are, respectively, a partial cross-sectional view of a third variation of the emissive substrate and a plan view of its dielectric layer top surface. In this variation the emission elements 126 are vertical emissive elements, with the first electrical contact 132 formed on its top surface (as above), and further comprise a second electrical contact 500 formed on the vertical emissive element bottom surface 130. The dielectric layer 110 further comprises an intersection via 502 associated with each well, exposing a corresponding second matrix trace 123. A local interconnect 504 overlies the dielectric layer 110 connecting a vertical emissive element second electrical contact 500 to the second matrix trace 123 through a corresponding column intersection via 502. For example, local interconnect 504 can be formed by inkjet printing or screen printing metallic particles, which are then sintered together. Please note that the positions of the CPCs with respect to the well bottom surface in the above figures are exemplary, as the CPCs are not limited to any particular location within the well. Further, although the above examples depict circular well shapes and circular emissive elements, other shapes such as rectangular or oval would also be enabling.

Figure 6A:
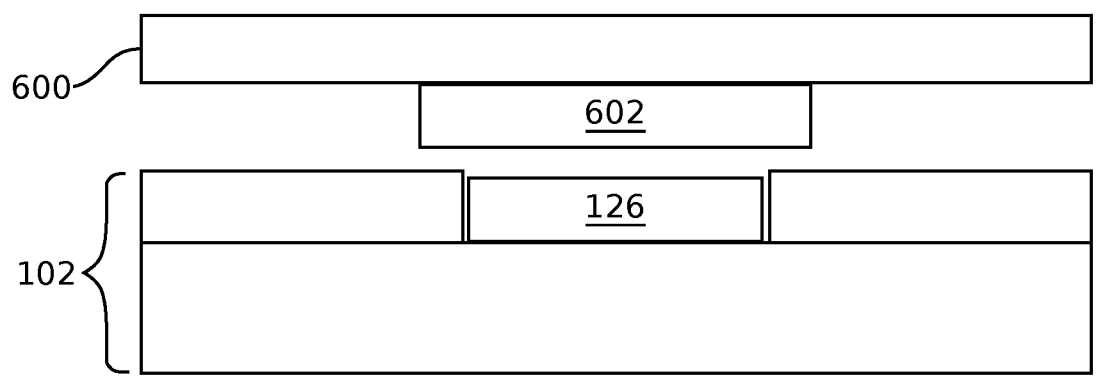
FIGS. 6A and 6B depict anyone of the emissive substrates described above with a color modifier overlying a top surface of the dielectric layer.
Figure 6B:
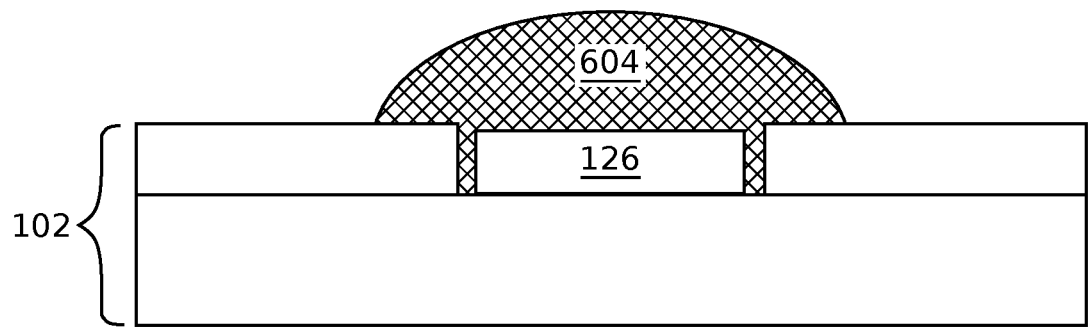

FIGS. 6A and 6B depict anyone of the emissive substrates described above with a color modifier overlying a top surface of the dielectric layer. A color modifier substrate 600 typically comprises a film or substance 602 that changes the color, diffuses, or concentrates the light emitted by an underlying emissive element 126, as shown in FIG. 6A. Alternatively, the color modifier can be coated directly on the emission elements 126. For example in FIG. 6B, quantum dots (QDs), which can down convert the emitting wavelength from the emission element, are mixed in a medium including silicon and epoxy and directly printed on the emissive element 126. A wide variety of conventional color modifier techniques are known that would be enabling.

Figure 7:
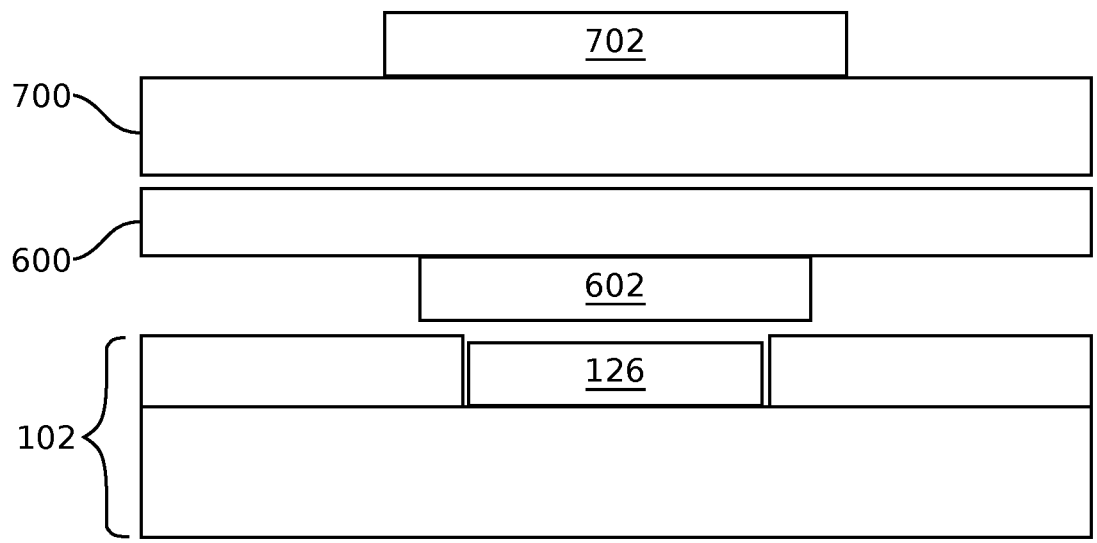
FIG. 7 depicts the combination emissive panel and color modifier substrate, with the addition of a liquid crystal display (LCD) panel overlying the top surface of the color modifier substrate.

FIG. 7 depicts the combination emissive panel and color modifier substrate, with the addition of a liquid crystal display (LCD) panel overlying the top surface of the color modifier substrate. The emissive substrate 102 selectively enables emissive elements 126, the color modifier substrate 600 supplies a particular light color or texture of light, and the liquid crystal matrix 702 of LCD panel 700 performs a light emission gating function. A wide variety of LCD panels types are known in the art that would be enabling. Alternatively but not shown, the LCD panel can be formed overlying an emissive panel with a color modifying substance directly printed overlying the emissive elements.

The emissive elements described above may be light emitting diodes (LEDs) or micro LEDs (μLEDs). Since a μLED is a two-terminal device, making a μLED array requires two layers of metal wiring (e.g., 2 control matrices). It is common to use monolithic integration processes in a thin-film transistor (TFT) LCD fabrication facility (fab) to make two layers of metal with an insulating layer between them. For this process, the two layers of metal and one layer of insulator are all deposited on top of a substrate. The substrate can be glass, ceramic, polyimide (PI) film, or similar.

However, there is a cheaper way to make substrates with multiple layer wiring using printed circuit board (PCB) technology. PCBs are commonly used for mechanical support and electrical connections between electronic components using conductive tracks, pads, and other features etched from copper sheets laminated onto a non-conductive substrate. PCBs can be single sided (one copper layer), double sided (two copper layers), or multi-layer (outer and inner layers). Conductors on different layers are connected by vias between layers. Some exemplary PCB materials include polychlorinated biphenyl, polyimide, polyether ether ketone (PEEK), polyester, polyethylene terephthalate (PET) and any other materials commonly used for printed circuit board (PCB) and flex printed circuits board (FPC).

The dimension of a typical μLED is in the range of 3-150 microns (μm), and the dimensions of the metal interconnects are usually in a similar range to arrange the substrate electrodes that form contacts to the μLED. The required metal dimensions can be easily formed using monolithic photolithography processes in integrated circuit (IC) and LCD fabs. It is an advantage if μLEDs can be assembled on the PCB.

The via hole that connects the PCB front surface metal and back surface metal is also a common PCB feature. However, the via hole is usually filled with metal (the most common metal being copper (Cu)) and the front surface metal and back surface metal thickness are in the range of 5 μm to 20 μm. To enable the μLED array described above, conventional PCB processes are modified so that the via is partially filled by metal, with an opening in each well.

Figure 8A:
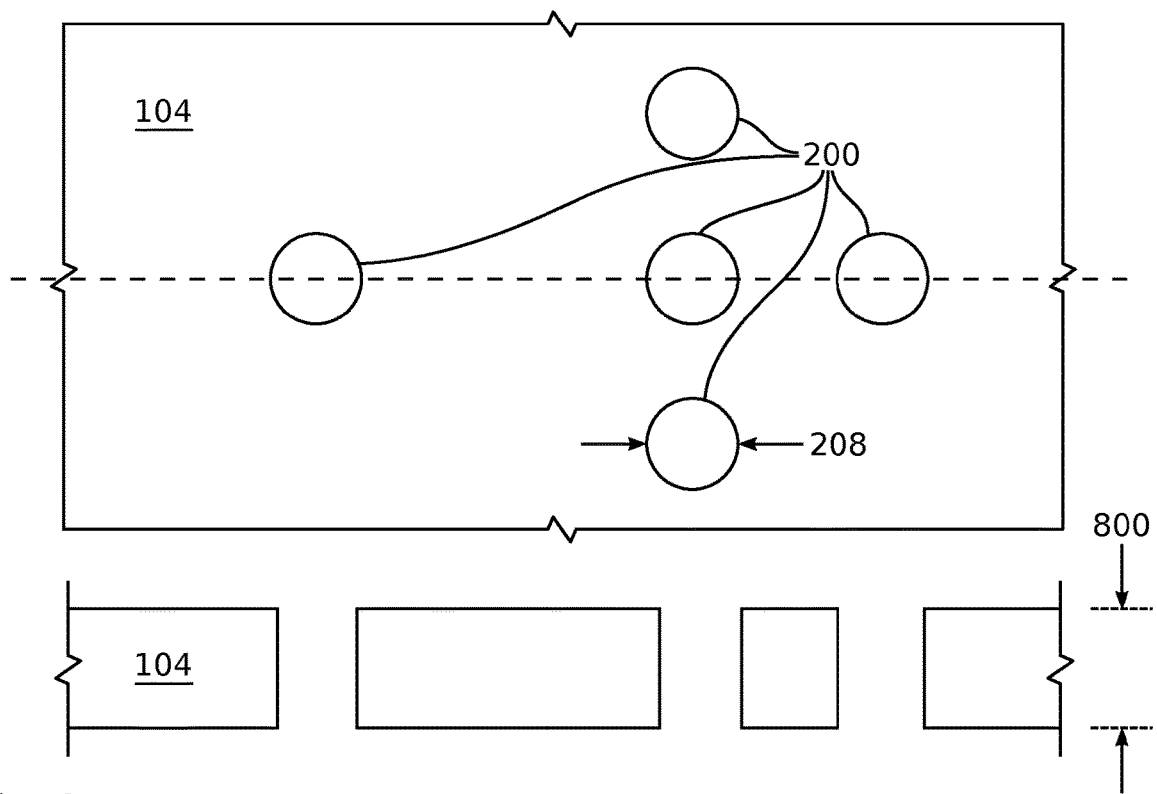
FIGS. 8A through 8D depict plan and partial cross-sectional views of a detailed process flow to form the emissive substrate of FIGS. 3A and 3B.
Figure 8B:
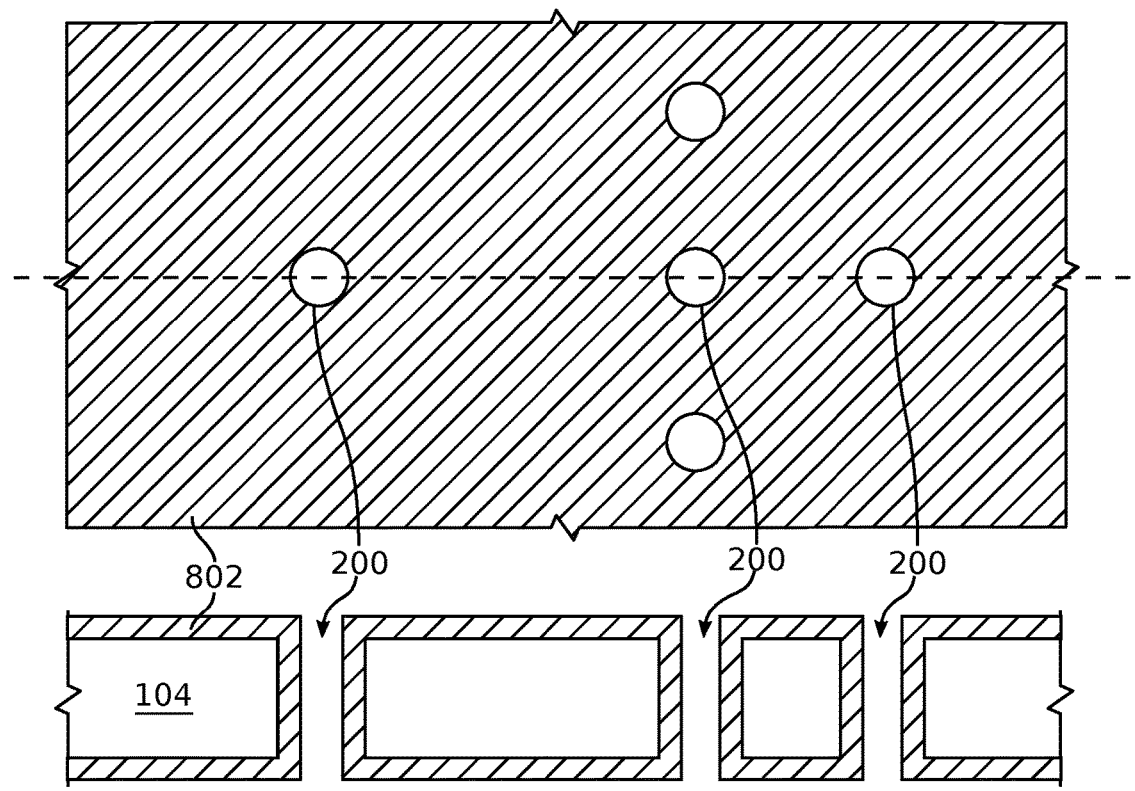
Figure 8C:
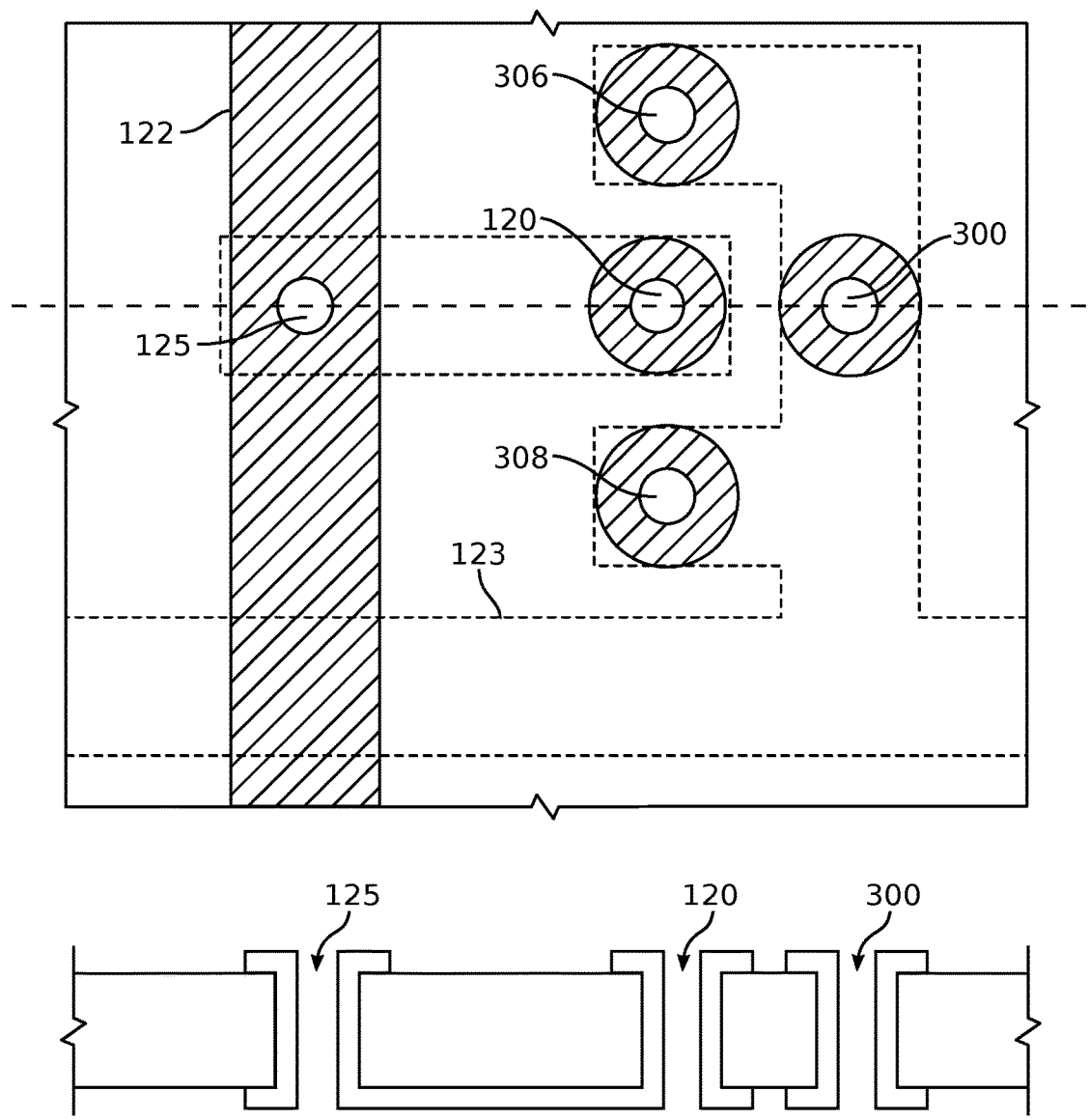
Figure 8D:
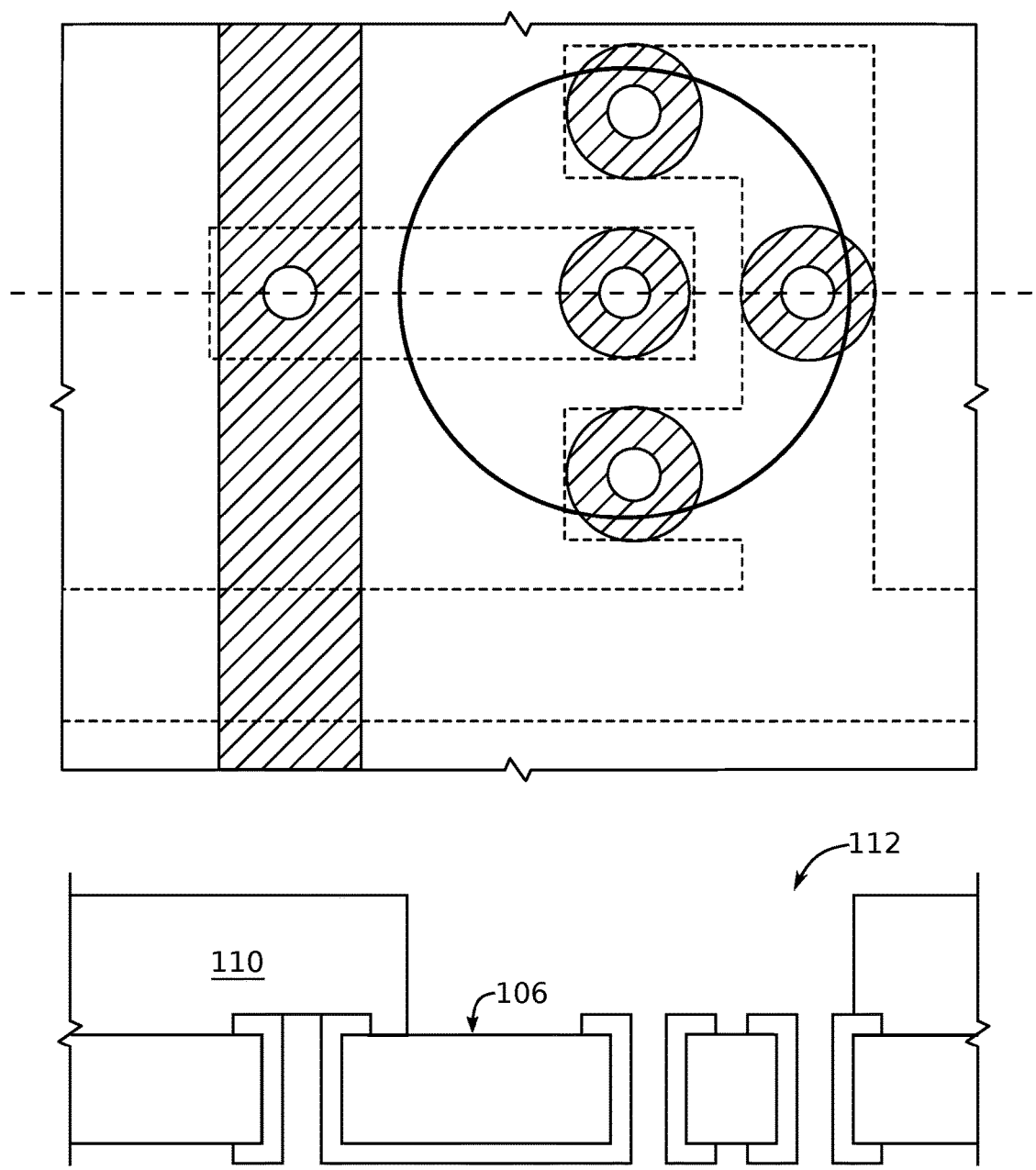
Figure 8E:
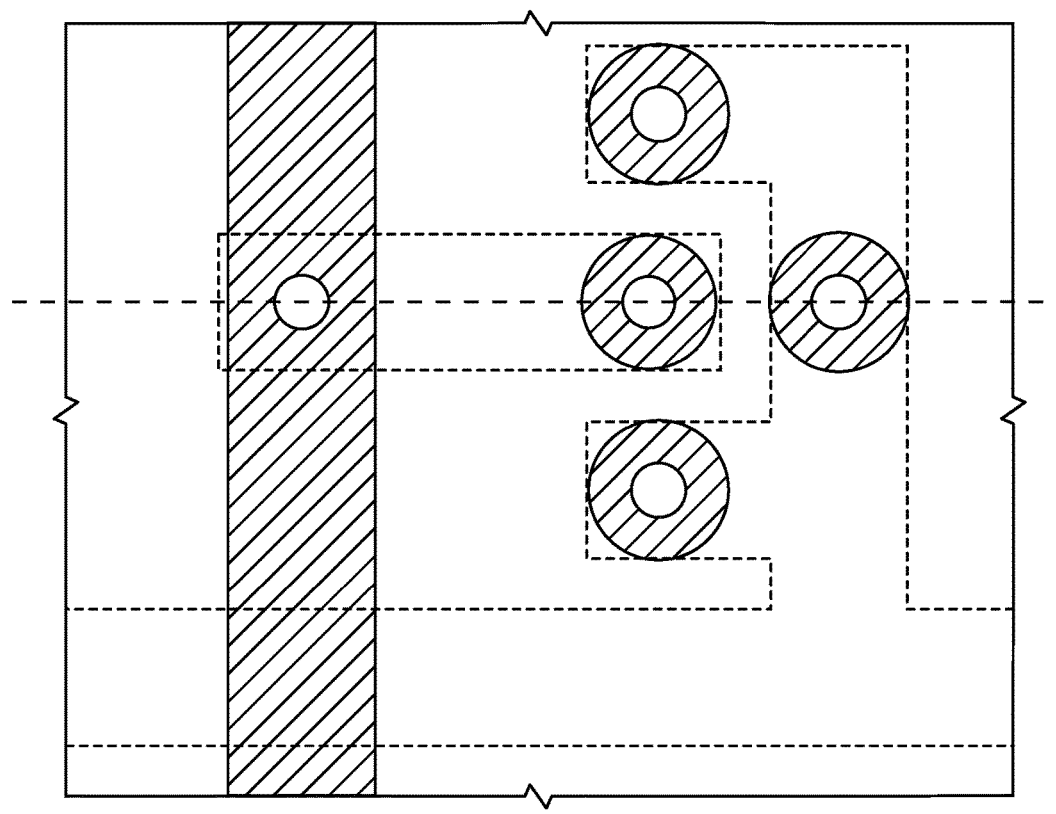
FIG. 8E depicts a process variation.
Figure 8E:
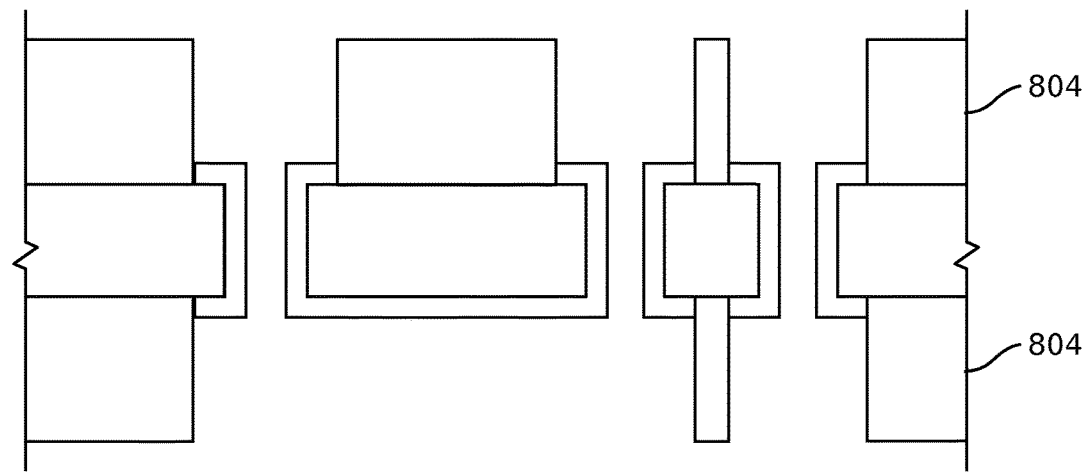

FIGS. 8A through 8D depict plan and partial cross-sectional views of a detailed process flow to form the emissive substrate of FIGS. 3A and 3B, and FIG. 8E depicts a process variation. In FIG. 8A a substrate (insulating layer) 104 is provided. The substrate material may be PI for example. The substrate thickness 800 is in the range of 10 μm to 300 μm, preferable 20 μm to 50 μm. Via holes 200 in the substrate 104 are formed by laser drilling or other mechanical ways. The via hole size 208 is between 5 μm to 100 μm, preferable 15 μm to 30 μm.

In FIG. 8B a metal film 802 is coated on the substrate (the top surface is shown). The metal film thickness is in the range of 0.2 μm and 3 μm, preferable 0.5 μm and 1.5 μm. The metal film does not completely fill the via holes, leaving the via holes still open. The metal film material can be Cu, gold (Au), a nickel (Ni)/Cu stack, a Ni/Cu/Au stack, or a Ni/Cu/tin (Sn) stack. The metal film is coated by chemical bath plating, electroless plating or electroplating, or the combination of the two. For example, electroless plating of a Ni film may be performed, followed by the electroplating of Cu film.

In FIG. 8C the front surface metal and the back surface metal is patterned. The photoresist (PR) can be applied by either dry film lamination or by liquid PR coating. After photo exposure and PR developing, the metal film is etched. Then, the PR is stripped and the front surface metal and back surface metal are patterning together forming CPCs 120, 125, 300, 306, and 308.

In FIG. 8D a dielectric layer 110 is applied on the top surface 106 and wells 112 are formed in the dielectric layer. Preferable, the dielectric layer 110 is photosensitive material so the pattern can be formed. The dielectric layer 110 can be either laminated on the substrate or coated on the substrate. After photo exposure, wells 112 are formed in the dielectric layer front surface.

As an alternative to FIGS. 8A through 8D, in FIG. 8E the metal growth area is defined by PR and then metals are deposited. Ni electroless plating may be performed with Ni in the thickness range of 50 nm to 200 nm deposited on both substrate surfaces 106 and 108 and inside the via holes to form CPCs 120, 125, 300, 306, and 308. Dry films or PR 804 are applied on both surfaces and photo patterned. Then, the electroplating of a Cu film, a Cu/Au film stack, or a Cu/Sn film stack is deposited on the PR opening areas, including the via holes. After PR strip and Ni removal, the substrate is complete.

FIGS. 9A and 9B depict alternative support mechanisms. For clarity, the emissive substrates are depicted without the dielectric layer. The substrate (insulating layer) 104 is between 75 and 200 μm thick depending on the process, and it is easily bent wrinkled or broken. As a result, it is often necessary to use some means of supporting the substrate so it is flat and can be handled for subsequent processing. The conventional method of supporting flexible substrate is to temporarily bond it to a metal foil typically of stainless steel. However, for the emissive substrate disclosed herein, access to vias (CPCs) can be used to enhance the μLED deposition process. Thus, it is useful to use a support that does not block the vias, so a negative pressure can be applied to the back side of the substrate. Two exemplary support structures that meet this requirement are depicted. In FIG. 9A a plate 900 is made of porous ceramic or glass frit, and in FIG. 9B an external frame 902 has a perimeter 904 that holds the edges of the substrate outside the array area with a glue bond or a clamp ring 906. The frame opening 908 permits the application of negative pressure to CPCs.

Figure 10C:
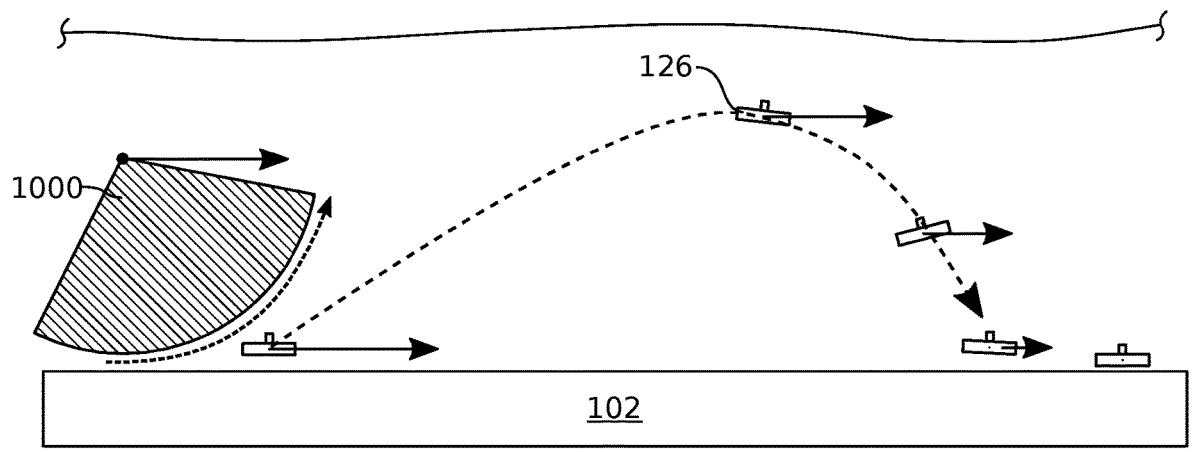
Figure 10D:
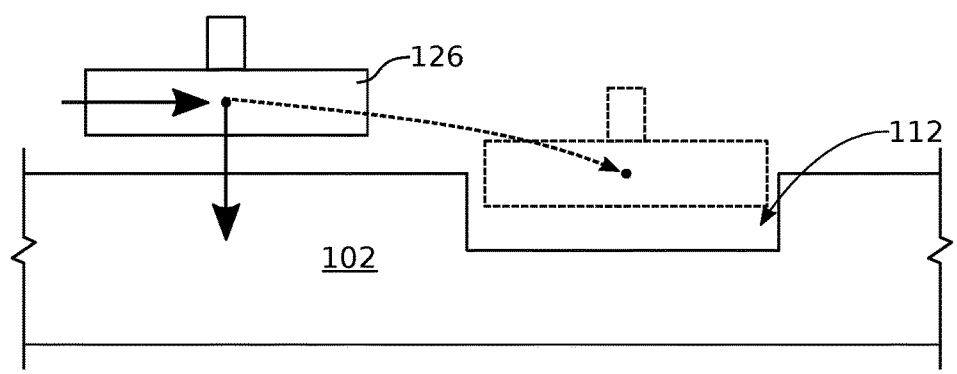

FIGS. 10A through 10D depict exemplary steps in the capture of emissive elements in the emissive panel. After completing the substrate fabrication, it can be used for fluidic assembly of an array of μLEDs as described in the application entitled DISPLAY WITH SURFACE MOUNT EMISSIVE ELEMENTS, invented by Schuele et al., filed Jan. 19, 2017, Ser. No. 15/410,001, which is incorporated herein by reference. Each μLED 126 is comprised of an anode and a cathode, referred to above as first and second electrical contacts 132 and 304 (FIGS. 10A and 10B). The general procedure for fluidic assembly is to apply a liquid layer consisting of μLEDs in a solvent suspension to the top surface of the emissive panel. The liquid may be agitated by means of a brush 1000 or other means to move the μLEDs over the substrate 102 (FIG. 10C) so that a μLED 126 can be captured in the well structure as shown in FIG. 10D. The well diameter is chosen to be larger than the diameter of the μLED, and the anode and cathode electrodes on the μLED are arranged to match the dimensions of the substrate electrodes.

Figure 11:
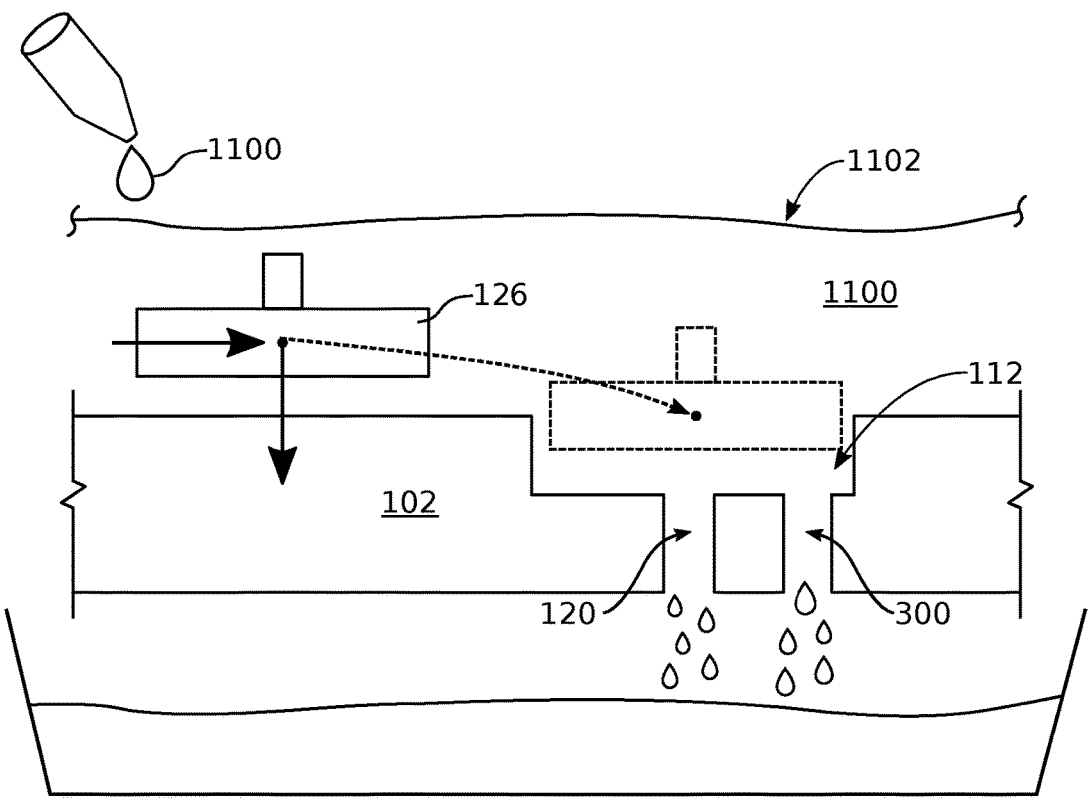
FIG. 11 is a partial cross-sectional view depicting the capture of an emissive element with the aid of negative pressure through the CPCs.

FIG. 11 is a partial cross-sectional view depicting the capture of an emissive element with the aid of negative pressure through the CPCs. The fluidic assembly apparatus requires that the fluid 1100 be at a consistent fluid level 1102 to achieve a controlled fluid velocity profile, and using the example of FIGS. 3A and 3B, CPCs 120 and 300 continuously remove some liquid so the system has a means of adding controlled amounts of liquid that vary as the assembly proceeds. The fluid 1100 added may be a solvent only or a solvent with a suspension of μLEDs to replace those that are removed by the assembly process, and the liquid may contain surfactants. The pressure differential caused by the CPCs adds a downward force on the μLED 126, which increases the fluid assembly filling rate by preventing escape.

Figure 12A:
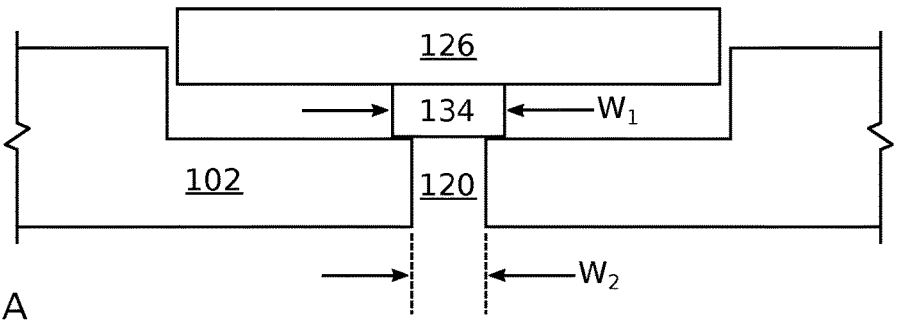
FIGS. 12A through 12D are partial cross-sectional views depicting aspects associated with the emissive element posts.
Figure 12B:
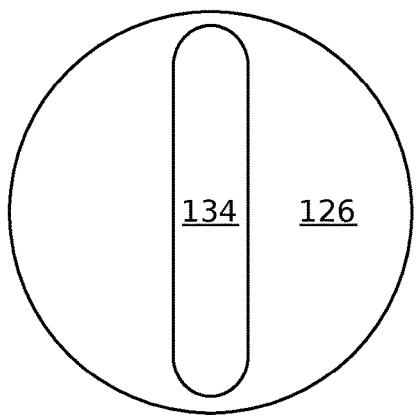
Figure 12C:
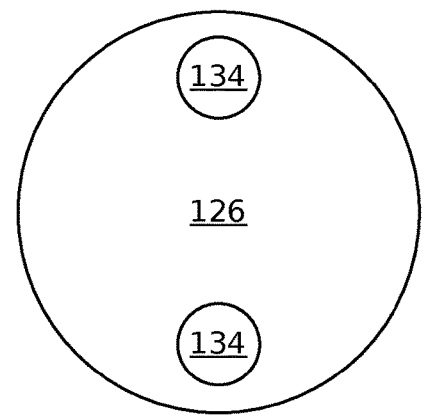
Figure 12D:
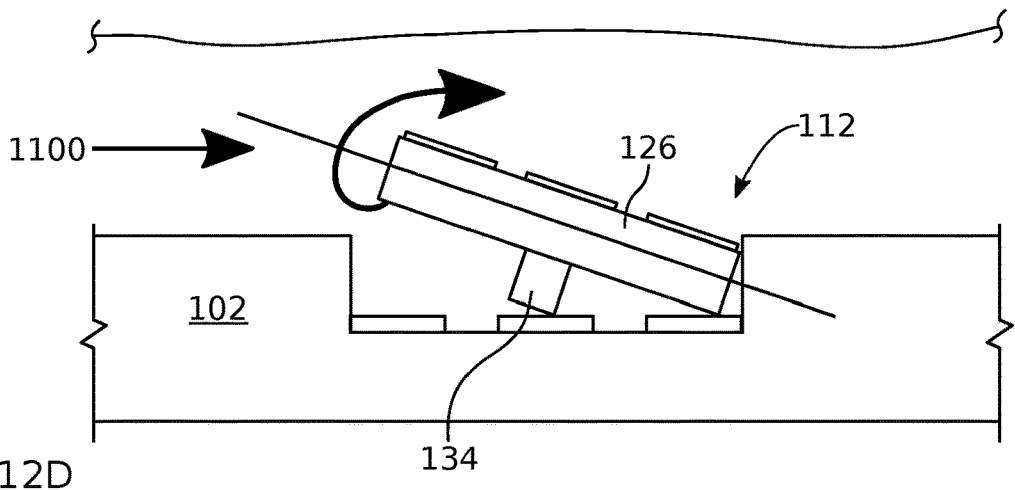

FIGS. 12A through 12D are partial cross-sectional views depicting aspects associated with the emissive element posts. As noted in Ser. No. 15/410,001 entitled SUBSTRATE FEATURES FOR ENHANCED FLUIDIC ASSEMBLY OF ELECTRONIC DEVICES, filed on Sep. 15, 2016, which is incorporated herein by reference, the presence of a through via can potentially interfere with the use of the post structure for oriented assembly. It is clear that a post entering the through via represents a serious failure, causing a well to be filled with an LED that cannot be connected to the substrate electrodes. One method to prevent this occurrence is to make the post 134 diameter (W1) larger than the via or CPC 120 diameter (W2) as shown in FIG. 12A. Other methods use a fin shaped post (FIG. 12B) or two off-center posts as shown in FIG. 12C. FIG. 12D shows that when incorrectly oriented in the well, the post 134 may cause the emissive element 126 to be caught in the liquid suspension 1100 flow current, and escape from the well.

Figure 13A:
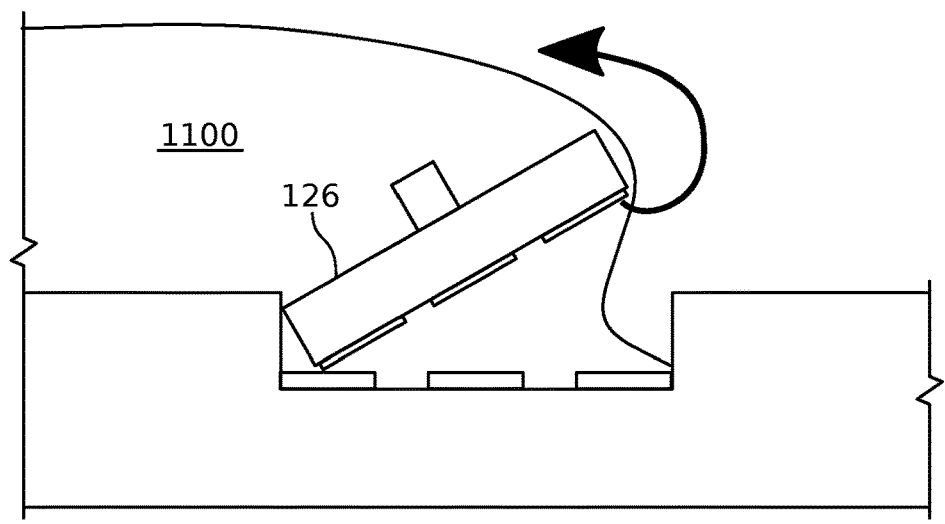
FIGS. 13A and 13B are partial cross-sectional views respectively depicting the effects of surface tension and negative pressure.
Figure 13B:
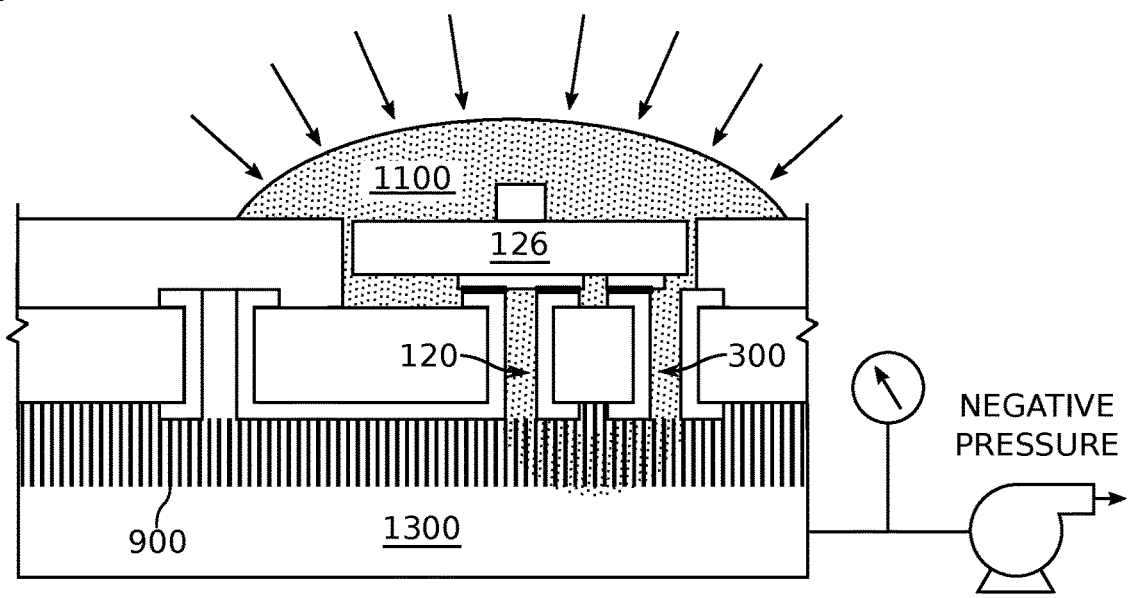

FIGS. 13A and 13B are partial cross-sectional views respectively depicting the effects of surface tension and negative pressure. When the array of wells is fully populated with μLEDs, the remaining μLEDs not in wells are removed by a cleaning operation and the solvent is removed by evaporation. The μLED is very small with a mass of approximately $3.3e^{-8}$ grams (gm) so the force of gravity holding the uLED down is only about 0.24 pascals (Pa). As a consequence, the cleaning and drying operations can disrupt the position of a μLED in the well when the force of moving liquid 1100 exceeds the holding force exerted by gravity and the well sidewalls. The surface tension of a liquid 1100 drying front can also tip a μLED out of the well as is shown schematically in FIG. 13A. It is clear that this escape mechanism is undesirable because the missing μLED causes a dark pixel.

Using the emissive substrate of FIGS. 3A and 3B as an example, the presence of CPCs 120 and 300 allows for control of the liquid level on the substrate surface by the application of negative pressure from a reservoir 1300 below, for example, using support 900. In this way the solvent 1100 used to assemble the disks can be removed quickly and in a controlled manner without relying on evaporation. The pressure differential also causes a stronger downward force on the μLED 126 than that of gravity alone.

After the fluidic assembly, clean-off and drying steps are performed, and the electrical connections between the μLED electrodes and substrate electrodes (emissive panel electrical interfaces) are formed by a process similar to soldering. The substrate electrodes are conductive metals, which may be gold, molybdenum, titanium, tungsten, silver, indium, tin, or copper, including layered and alloyed combinations. Similarly, the electrodes on the μLED anode and cathode may be composed of gold, molybdenum, titanium, tungsten, silver, indium, tin, or copper, including layered and alloyed combinations. The choice of metals on each component is chosen for conductivity and manufacturability, but mainly for formation of a bond and an electrical connection between the μLED and the substrate.

Figure 14A:
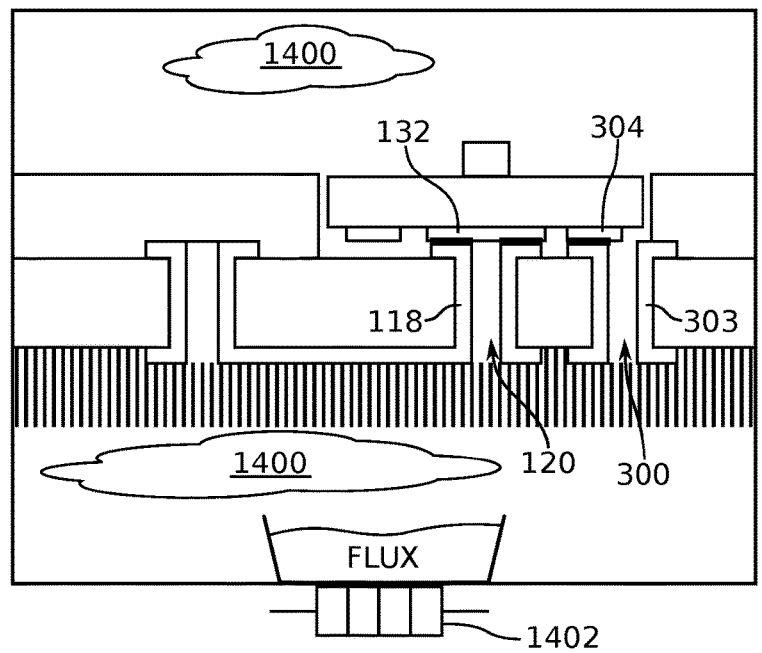
FIGS. 14A and 14B are partial cross-sectional views schematically depicting the application of solder flux.
Figure 14B:
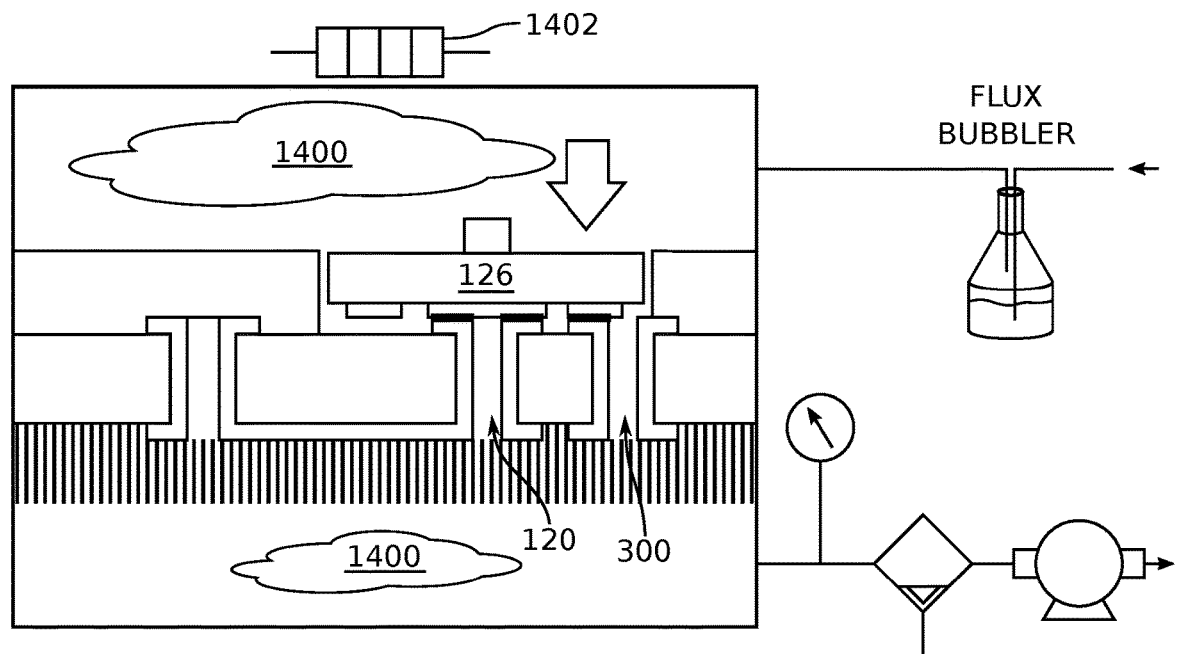

FIGS. 14A and 14B are partial cross-sectional views schematically depicting the application of solder flux. The bonding process may be done in two stages. First, a flux 1400 is applied to the interfaces to reduce the metal oxide on the surface of the electrodes. Then, the temperature is raised above the melting point, using heater 1402, so the metals alloy together to form a mechanical bond and electrical connection between the μLED contacts 132 and 304, and substrate electrodes 118 and 303. The interface area between electrodes is small and the pathways for liquid or vapor flux ingress are small, so it is desirable to use the through CPCs 120 and 300 as channels to introduce the flux directly at the electrode interface. FIG. 14A depicts an apparatus to perform thermal bonding using vapor flux (an organic acid such as formic acid is suitable) introduced from below.

As noted above, the mass of the μLED is very small so the downward force causing intimate contact between the two surfaces to be bonded is very low. In conventional surface mount soldering the component is much larger and heavier than the μLED 126, so the conventional component weight is sufficient to establish physical contact leading to soldering when the two electrodes are heated. The use of differential pressure to force flow and apply downward force on the μLED, as shown in FIG. 14B, also aids in bonding the μLED electrodes to the substrate electrode while pulling flux 1400 down to the μLED and substrate electrodes.

Figure 15:
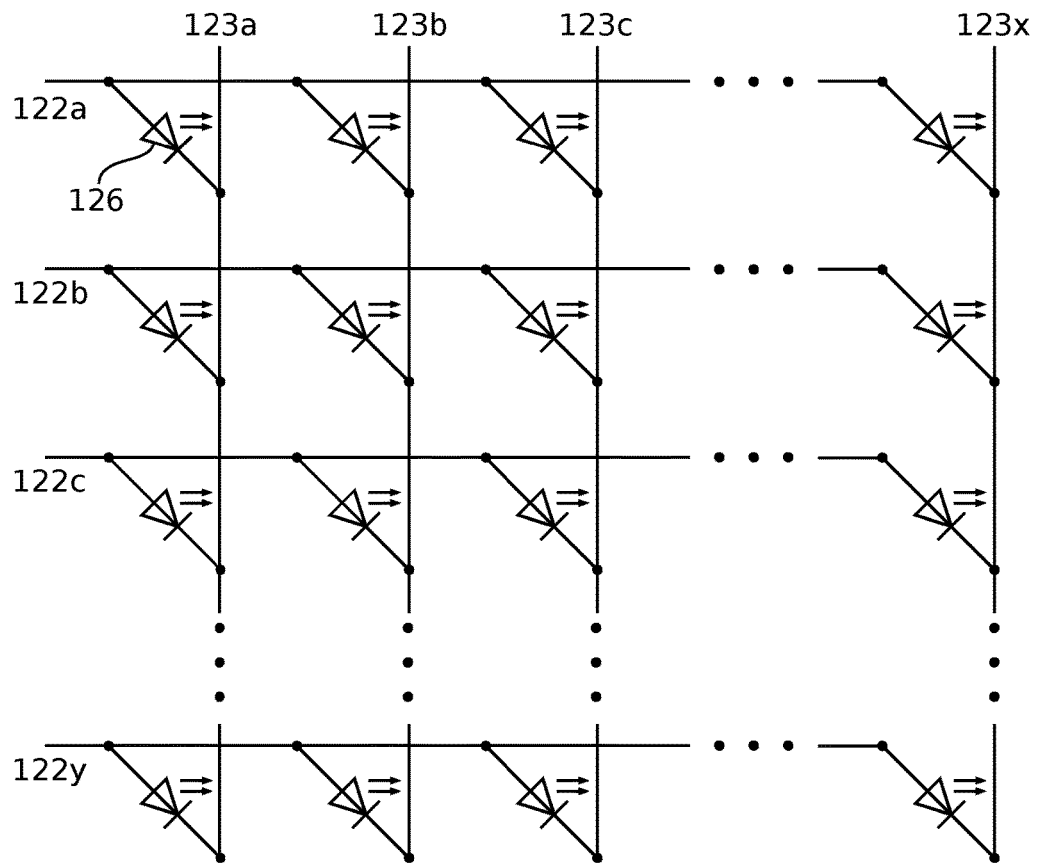
FIG. 15 is a schematic diagram of a passive matrix emissive panel array.

FIG. 15 is a schematic diagram of a passive matrix emissive panel array. Each pixel (emissive element) of the array can be accessed by the two metal wires, one trace from the first matrix—one of traces 122a through 122y, and one trace from the second matrix—one of traces 123a through 123x, so that each emissive element 126 in the array is parallel connected. Alternatively but not shown, the array can be arranged to make groups composed of several μLEDs connected in series, parallel, or series/parallel. These groups make larger area pixels with a higher brightness that can be used for very large displays or for the local dimming zones used in high dynamic range LCD backlights (BLUs).

Figure 16A:
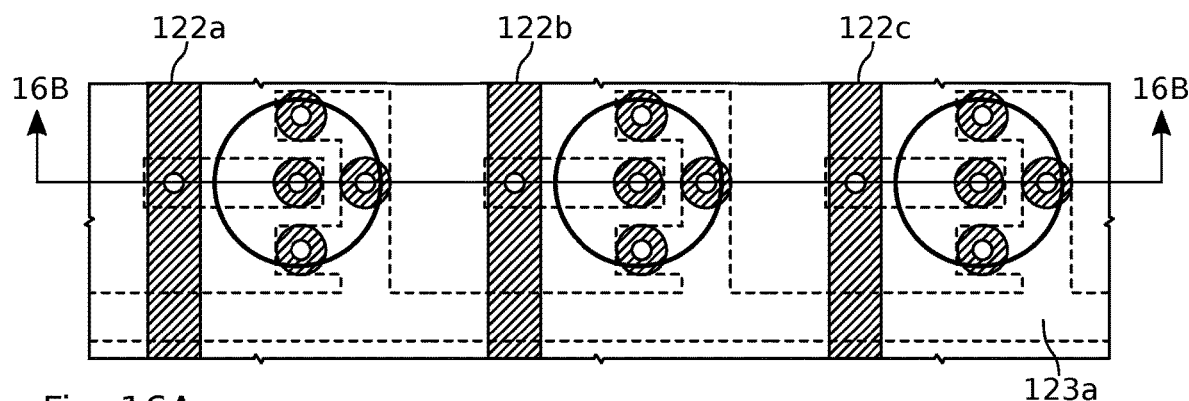
FIGS. 16A and 16B are, respectively, plan and partial cross-sectional views depicting how the emissive substrate of FIGS. 3A and 3B can be enabled as a passive array.
Figure 16B:
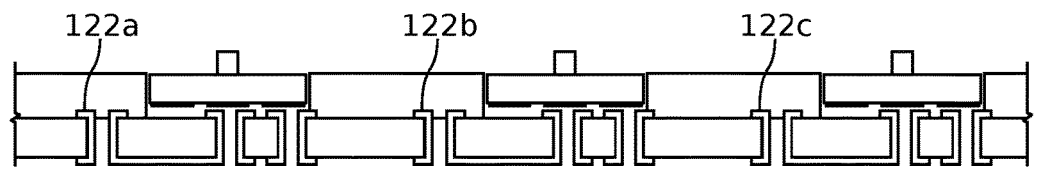

FIGS. 16A and 16B are, respectively, plan and partial cross-sectional views depicting how the emissive substrate of FIGS. 3A and 3B can be enabled as a passive array.

Figure 17A:
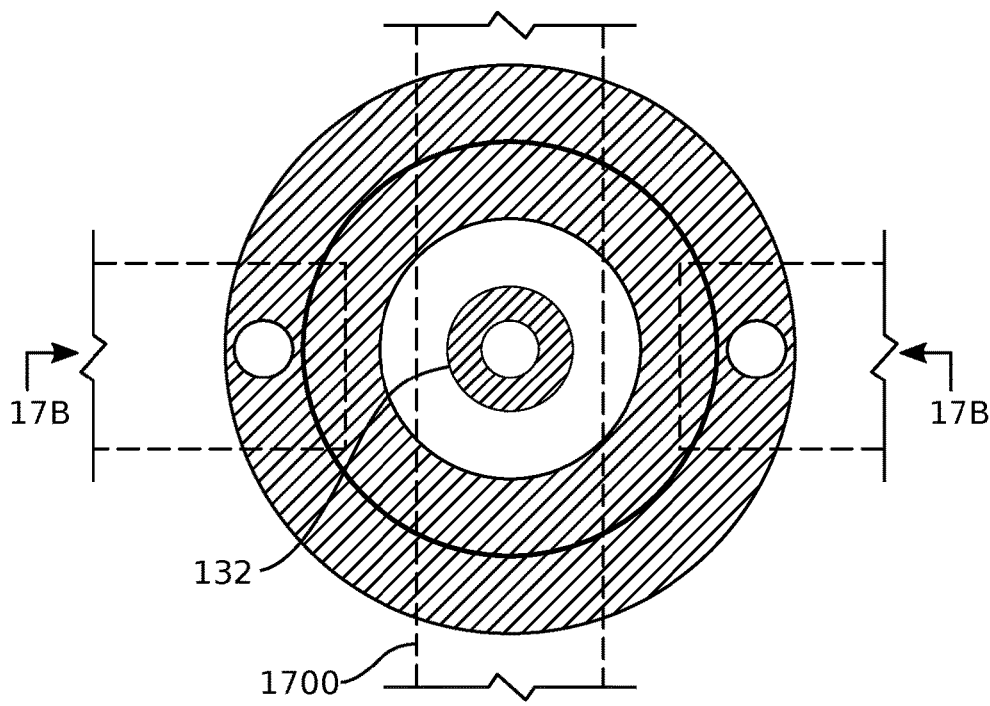
FIGS. 17A and 17B are, respectively, plan and partial cross-sectional views of an alternative related emissive substrate.
Figure 17B:
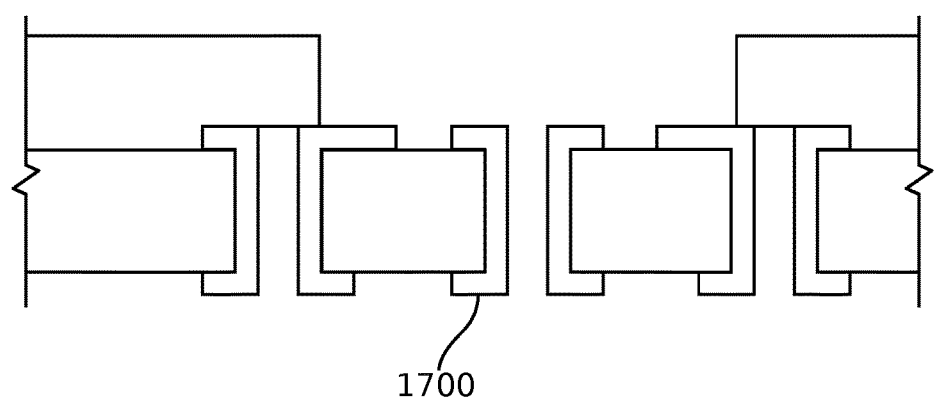

FIGS. 17A and 17B are, respectively, plan and partial cross-sectional views of an alternative related emissive substrate. One other advantage associated with the emissive substrate presented herein is that the well bottom electrical interface contact area surfaces may be made larger, while permitting the use of an emissive element second electrical contact formed as a continuous outer ring, to again increase the contact surface area. As shown, the emissive element center electrode 132 is connected to a line 1700 on the back side of the substrate so the outer electrode 304 can be a continuous ring.

Figure 18:
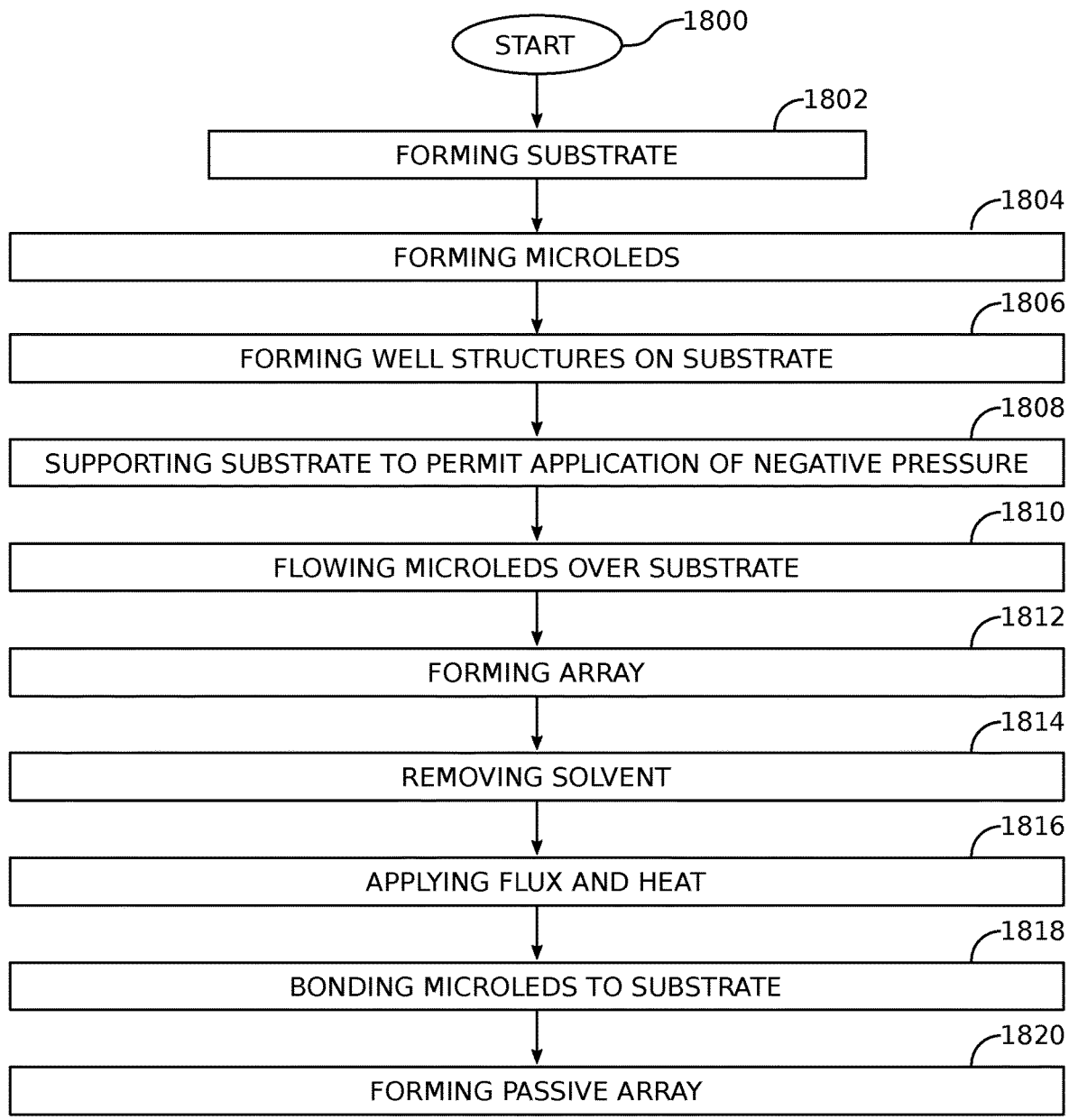
FIG. 18 is a flowchart briefly illustrating an exemplary process flow.

FIG. 18 is a flowchart briefly illustrating an exemplary process flow. The process begins at Step 1800. Step 1802 forms a substrate with electrodes on both sides and CPCs, with electrodes arranged to connect with μLEDs. Step 1804 separately forms μLEDs with anode and cathode electrodes on one surface and an alignment post on the opposite surface (FIGS. 3A and 3B, or FIGS. 4A and 4B). Step 1806 forms well structures on the substrate with a diameter larger than the μLED diameter, and a depth approximately equal to the thickness of μLED. Step 1808 supports the substrate so that a pressure differential can be applied across the membrane formed by the substrate. Step 1810 flows μLEDs suspended in solvent over the substrate surface, while controlling the solvent level and the flow of solvent through the CPCs. Step 1812 assembles μLEDs in well positions to form an array with μLED electrodes in contact with the appropriate substrate electrodes. Step 1814 removes solvent and dries the substrate by applying negative pressure. Step 1816 applies flux and heat to reduce the surface oxides on the metal electrodes. Step 1818 increase the temperature to form a bond between the μLED and substrate electrodes. In Step 1820 the completed array can be driven by display controller chips that apply voltage in sequence to successive rows of the array (passive matrix).

Figure 19:
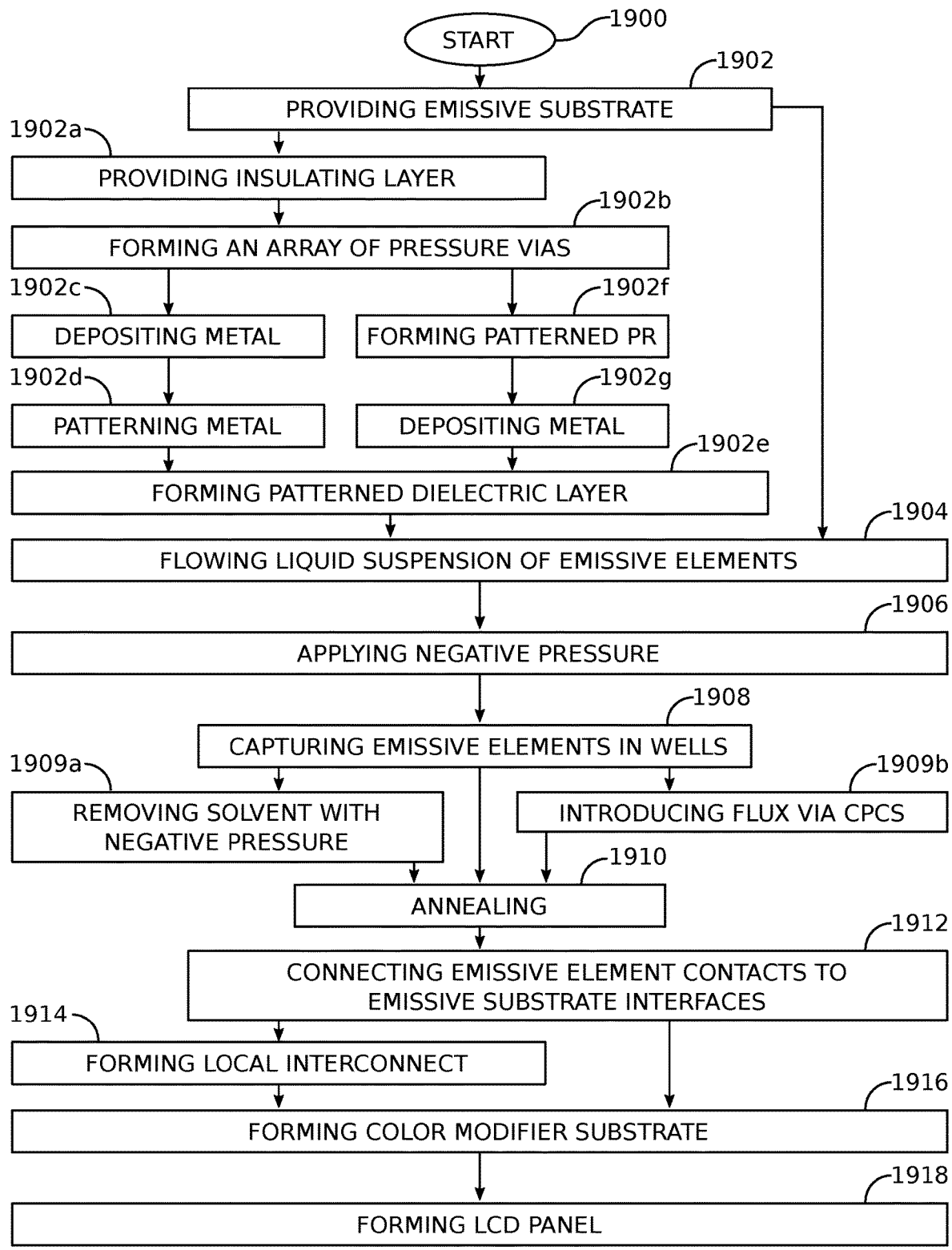
FIG. 19 is a flowchart illustrating a fluidic assembly method for the fabrication of emissive panels.

FIG. 19 is a flowchart illustrating a fluidic assembly method for the fabrication of emissive panels. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 1900.

Step 1902 provides an emissive substrate comprising an insulating layer with a top surface and a back surface, and a dielectric layer overlying the insulating layer top surface patterned to form a plurality of wells. Each well comprises a bottom surface formed on the insulating layer top surface with a first electrical interface electrically connected to a first conductive pressure channel, which is operatively connected to a conductive first matrix trace. As noted above, each conductive pressure channel comprises a pressure via with sidewalls formed between the well bottom surface and the insulating layer back surface. A metal layer coats the sidewalls and a medium flow passage is formed interior to the metal layer. Each pressure via has a minimum cross-sectional area, and the medium flow passage has a minimum cross-sectional area greater than 50% of the pressure via minimum cross-sectional area.

The emissive substrate further comprises a conductive second matrix of traces, where first matrix traces are formed on either the insulating layer top surface or the insulating layer bottom surface, and the second matrix traces are formed on the opposite insulating layer surface.

Step 1904 flows a liquid suspension of emissive elements across the dielectric layer. The liquid may, for example, be one of a number of types of alcohols, polyols, ketones, halocarbons, or water. In one aspect the emissive elements may be indium gallium nitride (InGaN), GaN, aluminum gallium indium phosphide (AlGaInP), or aluminum gallium nitride (AlGaN) LEDs. In another aspect, flowing the liquid suspension across the emissive substrate top surface includes engaging an auxiliary mechanism for distributing the emissive elements, such as a brush (rotating or non-rotating), wiper, rotating cylinder, or mechanical vibration. In another aspect, the emissive elements have a post, or more than one post, extending from, and connected to the emissive element bottom surface.

Step 1906 applies a negative pressure, from the insulating layer back surface to the wells, via the first conductive pressure channels. Step 1906 may be enabled by locating the insulating layer back surface overlying a porous support substrate and applying the negative pressure through the support substrate. Alternatively, the emissive substrate may be attached to a frame perimeter with a center opening, and the negative pressure applied through the frame opening. Step 1908 captures the emissive elements in the wells. In one aspect, the emissive elements are captured in response to the combination of the negative pressure and the suspension flow. Step 1910 anneals the emissive substrate, and in response to the annealing, Step 1912 electrically connects the first electrical contact of each emissive element to the first electrical interface of a corresponding well. In one aspect, Step 1909*a* removes solvent from the liquid suspension and dries the emissive substrate in response to negative pressure. In another variation, prior to annealing the emissive substrate in Step 1910, Step 1909*b* introduces a solder flux to each first electrical interface through a corresponding first conductive pressure channel. The fluxing agent may be a dimethylammonium chloride, diethanolamine, and glycerol solution dissolved in isopropanol, an organic acid, or a rosin-type flux, for example.

In one aspect, Step 1902 provides an emissive substrate where each well bottom surface additionally comprises a second electrical interface electrically connected to a second conductive pressure channel formed between the insulating layer top and back surfaces, with the second matrix traces operatively connected to corresponding second conductive pressure channels (see FIGS. 3A and 3B). Then, flowing the liquid suspension of emission elements in Step 1904 includes flowing emissive elements having a top surface with the first electrical contact and a second electrical contact. Step 1912 electrically connects the second electrical contact of each emissive element to the second electrical interface of a corresponding well, in response to the annealing performed in Step 1910.

More explicitly, providing the emissive substrate in Step 1902 may include the following substeps. Step 1902*a* provides the insulating layer. Step 1902*b* forms an array of pressure vias from the insulating layer top surface to the insulating layer back surface. Step 1902*c* deposits metal overlying the insulating layer top surface, insulating layer back surface, and pressure vias, wherein the pressure vias are coated with metal, leaving a medium flow passage. Step 1902*d* patterns the insulating layer top surface metal layer to expose well bottom surfaces and form the first matrix of traces, and patterns the insulating layer back surface to form the second matrix of traces. Step 1902*e* forms the patterned dielectric layer overlying the insulating layer top surface exposing the well bottom surfaces.

In alternative substeps, Step 1902*f* forms a photo-sensitive (PR) material overlying the insulating layer top surface and back surface, patterned to expose the pressure vias, first matrix trace regions, and second matrix trace regions. Step 1902*g* deposits metal overlying the insulating layer top surface, insulating layer back surface, and pressure vias. The pressure vias are coated with metal, leaving a medium flow passage.

In another aspect, Step 1902 provides an emissive substrate where the first matrix traces are formed on the insulating layer bottom surface and electrically connected to the first CPC, and each well bottom surface additionally comprises a second electrical interface electrically connected by a conductive intralevel trace, formed on the insulating layer top surface to a corresponding second matrix trace (see FIGS. 4A and 4B). Then, flowing the liquid suspension of emission elements in Step 1904 includes flowing emissive elements having a top surface with the first electrical contact and a second electrical contact. Step 1912 electrically connects the second electrical contact of each emissive element to the second electrical interface of a corresponding well, in response to the annealing performed in Step 1910.

In another variation, Step 1902 provides an emissive substrate with the first matrix traces being formed on the insulating layer bottom surface, and the dielectric layer has an intersection via associated with each well, exposing a corresponding second matrix trace. Flowing the liquid suspension of emissive elements in Step 1904 includes flowing vertical emissive elements having a top surface with the first electrical contact and a bottom surface with a second electrical contact. Subsequent to annealing the emissive substrate in Step 1910, Step 1914 forms a local interconnect from the second electrical contact of each emissive element to the corresponding second matrix trace on the insulating layer top surface through a corresponding intersection via (see FIGS. 5A and 5B). Prior to Step 1914 a dielectric material may be deposited to fill any gaps around the emissive elements in the wells to protect the first electrical interface and first electrical contact from being electrically shorted. After Step 1914 a second annealing may be performed to bond the second electrical contact to the local interconnect.

In one aspect, subsequent to electrically connecting the first electrical contacts to the first electrical interfaces in Step 1912, Step 1916 forms a color modifier overlying the emissive elements. As another option, subsequent to forming the color modifier in Step 1916, Step 1918 forms a liquid crystal display (LCD) panel overlying a top surface of the color modifier.

An emissive panel and associated emissive panel assembly processes have been presented. Examples of particular materials, dimensions, and circuit layouts have been presented to illustrate the invention. However, the invention is not limited to merely these examples. Other variations and embodiments of the invention will occur to those skilled in the art.

We claim:
1. An emissive panel comprising:
   an insulating layer comprising a top surface and a back surface;
   a dielectric layer overlying the insulating layer top surface, patterned to form a first plurality of wells, each well comprising a bottom surface formed on an exposed region of the insulating layer top surface, well sidewalls formed in the dielectric layer, a first electrical interface formed on the well bottom surface, and a first electrically conductive pressure channel formed between the first electrical interface and the insulating layer back surface;
   a control matrix comprising an electrically conductive first matrix of traces formed on a surface selected from a surface group consisting of the insulating layer top surface and the insulating layer bottom surface, and wherein an electrically conductive second matrix of traces is formed on an unselected surface from the surface group, where each first electrically conductive pressure channel is electrically connected to the first matrix;
   a first plurality of surface mount emissive elements populating the wells, each emissive element comprising:
      a top surface overlying a corresponding well bottom surface;
      a bottom surface; and,
      a first electrical contact formed on the emissive element top surface and connected to a corresponding well first electrical interface.

2. The emissive panel of claim 1 wherein each emissive element further comprises a post connected to, and extending from the emissive element bottom surface.

3. The emissive panel of claim 1 further comprising:
   a second electrical interface formed on each well bottom surface;
   intralevel traces connecting each second matrix trace to corresponding second electrical interfaces; and,
   wherein each emissive element further comprises a second electrical contact formed on the emissive element top surface, connected to a corresponding well second electrical interface.

4. The emissive panel of claim 1 wherein each electrically conductive pressure channel comprises:

a pressure via with sidewalls formed between the well bottom surface and the insulating layer back surface;
a metal layer coating the sidewalls; and,
a medium flow passage formed interior to the metal layer.

5. The emissive panel of claim 4 wherein each pressure via has a minimum cross-sectional area; and,
   wherein the medium flow passage has a minimum cross-sectional area greater than 50% of the pressure via minimum cross-sectional area.

6. The emissive panel of claim 4 wherein each pressure via has a cross-sectional area to pass a medium selected from the group consisting of a gas or a liquid.

7. The emissive panel of claim 1 further comprising:
   solder flux residue residing on the emissive element top surfaces and in the first electrically conductive pressure channels.

8. The emissive panel of claim 1 further comprising:
   a color modifier overlying the emissive elements.

9. The emissive panel of claim 8 further comprising:
   a liquid crystal display (LCD) panel overlying a top surface of the color modifier.

10. The emissive panel of claim 1 wherein the surface mount emissive elements are light emitting diodes (LEDs).

11. The emissive panel of claim 1 wherein the insulating layer is a printed circuit board (PCB).

12. The emissive panel of claim 1 wherein the first plurality of wells formed in the dielectric layer have a cross-sectional circular shape.

13. An emissive panel comprising:
   an insulating layer comprising a top surface and a back surface;
   a dielectric layer overlying the insulating layer top surface, patterned to form a first plurality of wells, each well comprising a bottom surface formed on an exposed region of the insulating layer top surface, well sidewalls formed in the dielectric layer, a first electrical interface and a second electrical interface formed on the well bottom surface, and a first conductive pressure channel formed between the first electrical interface and the insulating layer back surface;
   a control matrix comprising a conductive first matrix of traces formed on a surface selected from a surface group consisting of the insulating layer top surface and the insulating layer bottom surface, and wherein a conductive second matrix of traces is formed on an unselected surface from the surface group, where each first conductive pressure channel is operatively connected to the first matrix;
   a first plurality of surface mount emissive elements populating the wells, each emissive element comprising:
      a top surface overlying a corresponding well bottom surface;
      a bottom surface;
      a first electrical contact formed on the emissive element top surface and connected to a corresponding well first electrical interface;
      a second electrical contact formed on the emissive element top surface and connected to a corresponding well second electrical interface; and,
   wherein the control matrix further comprises intralevel traces connecting each second matrix trace to corresponding second electrical interfaces.

14. The emissive panel of claim 13 wherein each emissive element further comprises a post connected to, and extending from the emissive element bottom surface.

15. The emissive panel of claim 13 wherein each conductive pressure channel comprises:

a pressure via with sidewalls formed between the well bottom surface and the insulating layer back surface;
a metal layer coating the sidewalls; and,
a medium flow passage formed interior to the metal layer.

16. The emissive panel of claim 15 wherein each pressure via has a minimum cross-sectional area; and,
wherein the medium flow passage has a minimum cross-sectional area greater than 50% of the pressure via minimum cross-sectional area.

17. The emissive panel of claim 15 wherein each pressure via has a cross-sectional area to pass a medium selected from the group consisting of a gas or a liquid.

18. The emissive panel of claim 13 further comprising:
solder flux residue residing on the emissive element top surfaces and in the first conductive pressure channels.

19. The emissive panel of claim 13 further comprising:
a color modifier overlying the emissive elements.

20. The emissive panel of claim 19 further comprising:
a liquid crystal display (LCD) panel overlying a top surface of the color modifier.

21. The emissive panel of claim 13 wherein the surface mount emissive elements are light emitting diodes (LEDs).

22. The emissive panel of claim 13 wherein the insulating layer is a printed circuit board (PCB).

23. The emissive panel of claim 13 wherein the first plurality of wells formed in the dielectric layer have a cross-sectional circular shape.

\* \* \* \* \*